(12) United States Patent
Yamazaki et al.

(10) Patent No.: US 7,045,369 B2
(45) Date of Patent: May 16, 2006

(54) METHOD OF FABRICATING AND/OR REPAIRING A LIGHT EMITTING DEVICE

(75) Inventors: Shunpei Yamazaki, Tokyo (JP);
Yasuyuki Arai, Kanagawa (JP); Mai Osada, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 37 days.

(21) Appl. No.: 09/973,133

(22) Filed: Oct. 9, 2001

(65) Prior Publication Data
US 2002/0042152 A1    Apr. 11, 2002

(30) Foreign Application Priority Data
Oct. 10, 2000    (JP)    ............... 2000-309564

(51) Int. Cl.
*H01L 21/00*    (2006.01)
(52) U.S. Cl. ........................................................ 438/4
(58) Field of Classification Search ............... 252/55, 252/57, 427; 438/4, 22, 82, 99; 315/169.1, 315/169.2, 169.3; 345/76; 257/40, E51.022
See application file for complete search history.

(56) References Cited

U.S. PATENT DOCUMENTS

| | | | |
|---|---|---|---|
| 4,725,558 A | 2/1988 | Yamazaki et al. | ............ 437/2 |
| 4,806,496 A | 2/1989 | Suzuki et al. | ............ 437/4 |
| 4,951,041 A | 8/1990 | Inada et al. | |
| 5,343,054 A * | 8/1994 | Maroney et al. | ............ 257/184 |
| 5,414,443 A | 5/1995 | Kanatani et al. | |
| 5,552,678 A | 9/1996 | Tang et al. | |
| 5,641,991 A | 6/1997 | Sakoh | |
| 5,882,761 A | 3/1999 | Kawami et al. | |
| 5,990,629 A * | 11/1999 | Yamada et al. | ............ 315/169.3 |
| 6,087,245 A | 7/2000 | Yamazaki et al. | |
| 6,380,689 B1 | 4/2002 | Okuda | |
| 6,777,249 B1 | 8/2004 | Yamazaki | |
| 2002/0181276 A1* | 12/2002 | Yamazaki | ............ 365/175 |

FOREIGN PATENT DOCUMENTS

| | | |
|---|---|---|
| EP | 704912 | 4/1996 |
| EP | 704912 A1 * | 4/1996 |
| EP | 776147 | 5/1997 |
| JP | 10-041068 | 2/1988 |
| JP | 64-031197 | 2/1989 |

(Continued)

OTHER PUBLICATIONS

Tsutsui, Tetsuo, et al, "Electroluminescence in Organic Thin Films," Photochemical Processes in Organized Molecular Systems, pp. 437-450, 1991.

(Continued)

*Primary Examiner*—Brook Kebede
(74) *Attorney, Agent, or Firm*—Cook, Alex, McFarron, Manzo, Cummings & Mehler, Ltd.

(57) ABSTRACT

A method of repairing a light emitting device which makes high quality image display possible even if a pin hole is formed during formation of an EL layer is provided. The method of repairing a light emitting device is characterized in that a reverse bias voltage is applied to an EL element at given time intervals to thereby reduce a current flowing into an EL element when the reverse bias voltage is applied to the EL element.

27 Claims, 14 Drawing Sheets

FOREIGN PATENT DOCUMENTS

| | | |
|---|---|---|
| JP | 08-078519 | 3/1996 |
| JP | 08-180972 | 7/1996 |
| JP | 10-214060 | 8/1998 |
| JP | 10-232649 | 9/1998 |
| JP | 10-312173 | 11/1998 |
| JP | 2001-109432 | 4/2001 |
| WO | WO 98-33165 | 7/1998 |

OTHER PUBLICATIONS

Baldo, M.A. et al, "Highly Efficient Phosphorescent Emission from Organic Electroluminescent Devices," Nature, vol. 395, pp. 151-154, Sep. 10, 1998.

Baldo, M.A. et al, "Very High-Efficiency Green Organic Light-Emitting Devices Based on Electrophosphorescence," Applied Physics Letters, vol. 75, No. 1, pp. 4-6, Jul. 5, 1999.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, pp. L 1502-L 1504, Dec. 15, 1999.

Van Slykes et al Applied Physics Letters, vol. 69, No. 15, 1996, pp. 2160-2162.

Zou. D et al. Japanese Journal of Applied Physics, vol. 37, No. 11B. 1998, pp. L1406-L10408.

* cited by examiner

SCANNING LINE 804

DATA LINE 803

METHOD OF FABRICATING AND/OR REPAIRING A LIGHT EMITTING DEVICE

BACKGROUND OF THE INVENTION

1. Field of the Invention

The present invention relates to a method of fabricating and/or repairing an electroluminescence (EL) panel in which an electroluminescence (EL) element formed on a substrate is sealed between the substrate and a cover member. The Invention also relates to a method of repairing an EL module obtained by mounting an IC to the EL panel. The EL panel and the EL module are generically called light emitting devices in this specification.

2. Description of the Related Art

Being self-luminous, EL elements eliminate the need for a backlight that is necessary in liquid crystal display devices (LCDs) and thus make it easy to manufacture thinner displays. Also, the self-luminous EL elements are high in visibility and have no limit in terms of viewing angle. These are the reasons for attention that light emitting devices using the EL elements are receiving in recent years as electro-optical devices to replace CRTs and LCDs.

An EL element has a layer containing an organic compound that provides luminescence (electroluminescence) when an electric field is applied (the layer is hereinafter referred to as EL layer), in addition to a cathode layer and an anode layer. Luminescence obtained from organic compounds is classified into light emission upon return to a base state from singlet excitation (fluorescence) and light emission upon return to a base state from triplet excitation (phosphorescence). The repairing method of the present invention is applicable to a light emitting device whichever light emission the device uses.

All the layers that are provided between an anode and a cathode are an EL layer in this specification. Specifically, the EL layer includes a light emitting layer, a hole injection layer, an electron injection layer, a hole transporting layer, an electron transporting layer, etc. A basic structure of an EL element is a laminate of an anode, a light emitting layer, and a cathode layered in this order. The basic structure can be modified into a laminate of an anode, a hole injection layer, a light emitting layer, and a cathode layered in this order, or a laminate of an anode, a hole injection layer, a light emitting layer, an electron transporting layer, and a cathode layered in this order.

In this specification, an EL element emitting light is expressed as an EL element being driven. The EL element as defined herein is a light emitting element comprising an anode, an EL layer, and a cathode.

In general, an EL element is fabricated by forming one of electrodes, namely, an anode or a cathode, then forming an EL layer so as to contact the electrode, and lastly forming the other electrode, a cathode or an anode, so as to contact the EL layer.

The EL layer is formed mainly by evaporation or spin coating. With either method, manufacturers take trouble to wash a substrate before forming the EL layer and the electrodes, throughly monitor the cleanliness in a clean room where the film formation takes place, and the like.

Despite those efforts, sometimes dusts land on the electrodes or other portions to open a hole (pin hole) in the formed EL layer. FIG. 12A shows a simplified sectional view of an EL element 200 in which two electrodes 201 and 202 short-circuit. If there is a pin hole formed in an EL layer 203, the two electrodes 201 and 202 can be connected to each other in the pin hole to short-circuit when the electrode 202 is formed on the EL layer 203. Hereinafter, a portion having a pin hole where two layers sandwiching a light emitting layer are connected to each other is called a defect portion 204.

FIG. 13A shows the voltage-current characteristic of an EL element that has no defect portion whereas FIG. 13B shows the voltage-current characteristic of an EL element that suffers from short circuit at a defect portion.

Comparing FIGS. 13A and 13B, the amount of current flowing in the EL element 200 when a reverse bias voltage is applied to the EL element 200 is larger in the case of FIG. 13B.

This is because two electrodes short-circuit in the defect portion 204 in the case of FIG. 13B unlike that of FIG. 13A and a current flows through the defect portion 204.

Short circuit of the two electrodes 201 and 202 taking place in the defect portion 204 reduces the luminance of light emitted from the EL layer. The current flow when a forward bias voltage is applied to the EL element having the defect portion is schematically shown in FIG. 12B.

When the two electrodes 201 and 202 short-circuit in the defect portion 204, the defect portion 204 supposedly has a resistance $R_{SC}$ and connects the two electrodes of the EL element 200 to one another. Then, when a current flowing in the defect portion 204 is given as $I_{SC}$ and a current flowing in the EL layer 203 is given as $I_{d10}$, a forward current $I_{on}$ caused to flow from one of the electrodes of the EL element satisfies the following equation:

$$I_{on} = I_{SC} + I_{d10}$$

Therefore, when $I_{on}$ is constant in the above equation $I_{on} = I_{SC} + I_{d10}$, the current $I_{dio}$ that actually flows in the EL layer 203 is reduced in the EL element having the defect portion. This tendency is enhanced when the resistance $R_{SC}$ in the defect portion 204 is small and $I_{SC}$ is accordingly large, thereby increasing the need for rectification in the EL element 200.

When the current $I_{d10}$ flowing in the EL layer 203 is small, the luminance of light emitted from the EL element 200 is also small. In other words, the short circuit in the defect portion causes the EL element to emit light of lower luminance upon application of a forward bias voltage than in the case where no short circuit takes place.

The results are the same even when the EL layer is a laminate of plural layers and the pin hole formed in the light emitting layer connects a hole injection layer or a hole transporting layer to an electron injection layer or an electron transporting layer. The portion where the hole injection layer or the hole transporting layer is connected to the electron injection layer or the electron transporting layer receives a reverse bias current flow similar to the defect portion where the electrodes short-circuit. Therefore, this portion can also be a cause of the EL element emitting light of low luminance. Hereinafter, every portion where two layers sandwiching a light emitting layer are connected to each other in a pin hole formed in the light emitting layer is generically called a defect portion.

In addition to lowering the luminance of light emitted from the EL element, the short circuit in the defect portion accelerates degradation of a part of the EL layer that surrounds the defect portion since there is always a current flow in the defect portion.

SUMMARY OF THE INVENTION

The present invention has been made in view of the above problems, and an object of the present invention is to present a method of repairing a defect portion.

The present inventors have thought that, even though an EL element has a defect portion, reduction of current flowing in an EL layer when a forward bias voltage is applied can be avoided by increasing the resistance in the defect portion.

Thus devised is a method of increasing a resistance $R_{SC}$ in the defect portion by applying a reverse bias voltage to the EL element to cause a reverse bias current $I_{rev}$ to flow.

When the reverse bias current $I_{rev}$ is caused to flow in the EL element, most part of it flows into the defect portion where the short circuit takes place instead of flowing into the EL layer. If a large current flows through the defect portion, the temperature in the defect portion is raised to cause some changes in the defect portion, including burnout of the defect portion, vaporization of the defect portion, and transform of the defect portion into an insulator due to oxidization or carbonization. As a result of the changes, the resistance $R_{SC}$ is increased. In this specification, the defect portion whose resistance $R_{SC}$ is increased by a reverse bias current flowing thereinto is called a transmuted portion.

With the resistance $R_{SC}$ increased, the current flowing into the transmuted portion when a forward bias voltage is applied to the EL element is reduced whereas the current flowing into the EL layer is increased, thereby raising the luminance of emitted light.

Having high resistance $R_{SC}$, the transmuted portion hardly allows a current to flow therein in contrast to the defect portion where there is always a flow of current to accelerate degradation of a part of the EL layer that surrounds the defect portion. Therefore, degradation is not accelerated in a part of the EL layer that surrounds the transmuted portion.

The fabricating and/or repairing method of the present invention is applicable not only to an active matrix light emitting device but also to a passive matrix light emitting device. The structure of the present invention will be shown below.

According to the present invention, there is provided a method of fabricating and/or repairing a light emitting device by applying a first voltage and a second voltage to an EL element in order, characterized in that the first voltage and the second voltage are reverse bias voltages of different levels.

According to the present invention, there is provided a method of fabricating and/or repairing a light emitting device by gradually changing a voltage applied to an EL element from a first voltage to a second voltage, characterized in that the first voltage and the second voltage are reverse bias voltages of different levels.

According to the present invention, there is provided a method of fabricating and/or repairing a light emitting device having an EL element that includes an anode, an EL layer, and a cathode, the EL layer being in contact with the anode and the cathode being in contact with the EL layer, characterized in that a first voltage and a second voltage are applied in order between the anode and the cathode, and the first voltage and the second voltage are reverse bias voltages of different levels.

According to the present invention, there is provided a method of fabricating and/or repairing a light emitting device having an EL element that includes an anode, an EL layer, and a cathode, the EL layer being in contact with the anode and the cathode being in contact with the EL layer, characterized in that a voltage applied between the anode and the cathode is gradually changed from a first voltage to a second voltage, and the first voltage and the second voltage are reverse bias voltages of different levels.

According to the present invention, there is provided a method of fabricating and/or repairing a light emitting device having an EL element that includes an anode, an EL layer, and a cathode, the EL layer being in contact with the anode and the cathode being in contact with the EL layer, characterized in that a first voltage and a second voltage are applied in order between the anode and the cathode, thereby making a portion where a reverse-bias current flows between the anode and the cathode insulating or highly resistive, and the first voltage and the second voltage are reverse bias voltages of different levels.

According to the present invention, there is provided a method of fabricating and/or repairing a light emitting device having an EL element that includes an anode, an EL layer, and a cathode, the EL layer being in contact with the anode and the cathode being in contact with the EL layer, characterized in that a voltage applied between the anode and the cathode is gradually changed from a first voltage to a second voltage, thereby making a portion where a reverse-bias current flows between the anode and the cathode insulating or highly resistive, and the first voltage and the second voltage are reverse bias voltages of different levels.

According to the present invention, a method of fabricating and/or repairing a light emitting device can be characterized in that the first voltage and the second voltage are within ±15% of an avalanche voltage of the EL element.

According to the present invention, there is provided a method of fabricating and/or repairing a light emitting device by applying a first voltage and a second voltage to an EL element in order, characterized in that the first voltage is a ground voltage while the second voltage is a reverse bias voltage.

According to the present invention, there is provided a method of fabricating and/or repairing a light emitting device by gradually changing a voltage applied to an EL element from a first voltage to a second voltage, characterized in that one of the first voltage and the second voltage is a ground voltage while the other is a reverse bias voltage.

According to the present invention, there is provided a method of fabricating and/or repairing a light emitting device having an EL element that includes an anode, an EL layer, and a cathode, the EL layer being in contact with the anode and the cathode being in contact with the EL layer, characterized in that a first voltage and a second voltage are applied in order between the anode and the cathode, and the first voltage is a ground voltage while the second voltage is a reverse bias voltage.

According to the present invention, there is provided a method of fabricating and/or repairing a light emitting device having an EL element that includes an anode, an EL layer, and a cathode, the EL layer being in contact with the anode and the cathode being in contact with the EL layer, characterized in that a voltage applied between the anode and the cathode is gradually changed from a first voltage to a second voltage, and one of the first voltage and the second voltage is a ground voltage while the other is a reverse bias voltage.

According to the present invention, there is provided a method of fabricating and/or repairing a light emitting device having an EL element that includes an anode, is an EL layer, and a cathode, the EL layer being in contact with the anode and the cathode being in contact with the EL layer, characterized in that a first voltage and a second voltage are applied in order between the anode and the cathode, thereby making a portion where a reverse-bias current flows between the anode and the cathode insulating or highly resistive, and the first voltage is a ground voltage while the second voltage is a reverse bias voltage.

According to the present invention, there is provided a method of fabricating and/or repairing a light emitting device having an EL element that includes an anode, an EL layer, and a cathode, the EL layer being in contact with the anode and the cathode being in contact with the EL layer, characterized in that a voltage applied between the anode and the cathode is gradually changed from a first voltage to a second voltage, thereby making a portion where a reverse-bias current flows between the anode and the cathode insulating or highly resistive, and one of the first voltage and the second voltage is a ground voltage while the other is a reverse bias voltage.

According to the present invention, a method of fabricating and/or repairing a light emitting device can be characterized in that the reverse bias voltage is within ±15% of an avalanche voltage of the EL element.

DETAILED DESCRIPTION OF THE PREFERRED EMBODIMENTS

[Embodiment Mode]

Figure 1A:
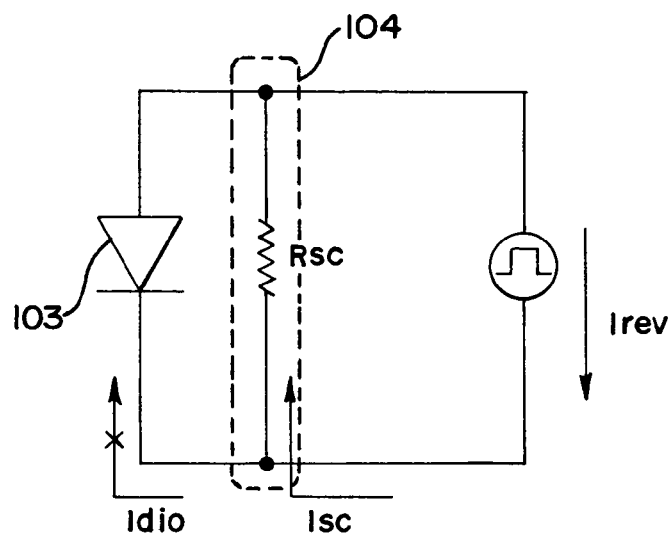
FIGS. 1A and 1B are diagrams schematically showing the current flow in an EL element when a reverse bias voltage is applied to the EL element.
Figure 1B:
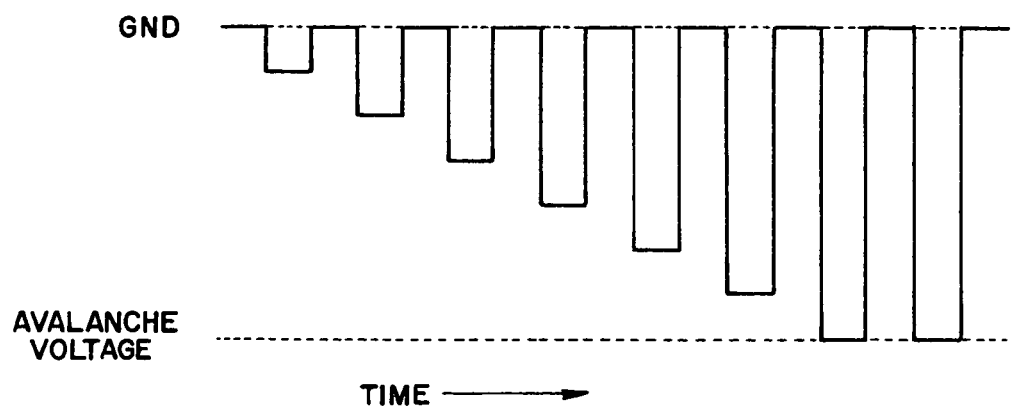

A fabricating and/or repairing method of the present invention will be described with reference to FIGS. 1A and 1B. FIG. 1A is a diagram schematically showing the current flow in an EL element having a defect portion when a reverse bias voltage is applied to the EL element.

A ground voltage GND and a reverse bias voltage $V_{rev}$ are alternately applied to the EL element. FIG. 1B is a timing chart of when the ground voltage GND and the reverse bias voltage $V_{rev}$ are alternately applied. Note that the present invention is not limited to the structure of this embodiment mode, namely, alternate application of the ground voltage GND and the reverse bias voltage $V_{rev}$. The invention only requires application of a reverse bias voltage to the EL element. Accordingly, the combination of voltages to be applied alternately to the EL element may be a combination of a forward voltage and the reverse bias voltage $V_{rev}$, or a combination of the reverse bias voltage $V_{rev}$ and a reverse bias voltage that is not equal with $V_{rev}$.

In this embodiment mode, the reverse bias voltage is applied to the EL element at given time intervals. However, the present invention is not limited thereto and a direct reverse bias voltage may be applied to the EL element.

The reverse bias voltage is gradually increased until avalanche takes place to cause an avalanche current to flow into the EL element in this embodiment mode. The voltage at which the avalanche current starts to flow into the EL element is herein called an avalanche voltage. However, the present invention is not limited thereto and the level of voltage to be applied to the EL element can be set suitably by a designer. An appropriate level of voltage applied to the EL element is high enough to transmute the defect portion but is not so high as to damage the El element or degrade its EL layer.

The voltage level is gradually increased also when the voltage is a direct reverse bias voltage.

Alternatively, a reverse bias voltage of constant level may be applied to the EL element at given time intervals or a direct reverse bias voltage of constant level may be applied.

By applying a reverse bias voltage to the EL element at given time intervals, it is possible to prevent a part of the EL layer that surrounds the defect portion from being degraded by heat generated from application of the reverse bias voltage.

The gradual increase in level of the reverse bias voltage makes it easy to find the level of reverse bias voltage that is optimal for repairing that particular EL element.

When the reverse bias voltage $V_{rev}$ is applied to the EL element, a reverse bias current $I_{rev}$ flows into the EL element. The reverse bias current $I_{rev}$ satisfies $I_{rev}=I_{d10}+I_{SC}$, wherein $I_{d10}$ represents a current flowing in an EL layer 103 and $I_{SC}$ represents a current flowing in a defect portion 104. However, the reverse bias current hardly flows into the EL layer and $I_{rev} \approx I_{SC}$ is assumed.

When the current $I_{rev}$ flows into the defect portion 104, the temperature in the defect portion 104 is raised to cause burnout of the defect portion, vaporization of the defect portion, or transform of the defect portion into an insulator due to oxidization or carbonization, thereby changing the defect portion into the transmuted portion. A resistance $R_{SC}$ is thus increased.

Figure 2A:
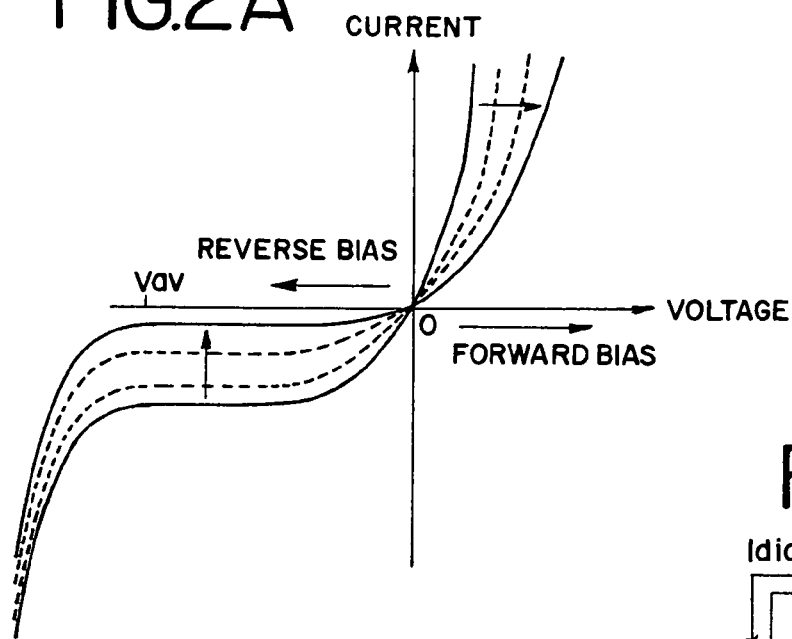
FIGS. 2A and 2B are diagrams schematically showing a change in voltage-current characteristic of an EL element in the middle of repairing process and the current flow in the EL element when a forward bias voltage is applied to the EL element after repairing.

FIG. 2A shows a change with time in voltage-current characteristic of the EL element having the defect portion 104 when the repairing method of the present invention is employed. The voltage-current characteristic curve shifts with time toward directions indicated by arrows. $V_{av}$ represents the avalanche voltage. Upon application of a reverse bias voltage, the resistance $R_{SC}$ of the defect portion increases as the time elapses accompanied by reduction of the current $I_{SC}$ that flows through the defect portion. The amount of current flowing into the EL element is thus reduced.

Figure 2B:
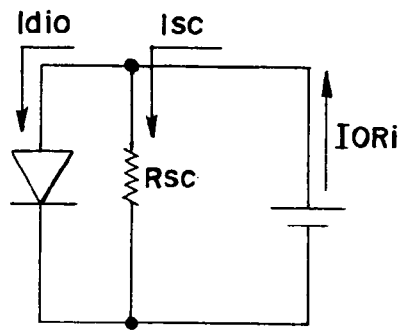

FIG. 2B schematically shows the current flow in the EL element when a forward bias voltage is applied to the EL element. A reduction of the current $I_{SC}$ flowing through the defect portion results in an increase in current $I_{d10}$ that actually flows into the EL layer when a forward bias voltage is applied to the EL element. thereby raising the luminance of emitted light.

The method of the present invention can increase the amount of current actually flowing through the EL layer upon application of a forward bias voltage to the EL element even if a pin hole is formed in the EL layer during formation of the layer due to dusts or the like and two layers sandwiching a light emitting layer short-circuit, because the method can raise the resistance of the defect portion where the short circuit takes place by changing the defect portion into the transmuted portion. Therefore the repairing method of the present invention can raise the luminance of emitted light with application of the same level of voltage despite the presence of the defect portion.

Having high resistance $R_{SC}$, the transmuted portion hardly allows a current to flow therein in contrast to the defect portion where there is always a flow of current to accelerate degradation of a part of the EL layer that surrounds the defect portion. Therefore, degradation is not accelerated in a part of the EL layer that surrounds the transmuted portion.

Embodiments of the present invention will be described below.

[Embodiment 1]

This embodiment gives a description on a case of applying a repairing method of the present invention to an active matrix light emitting device that has two thin film transistors (TFTs) in each pixel.

Figure 3:
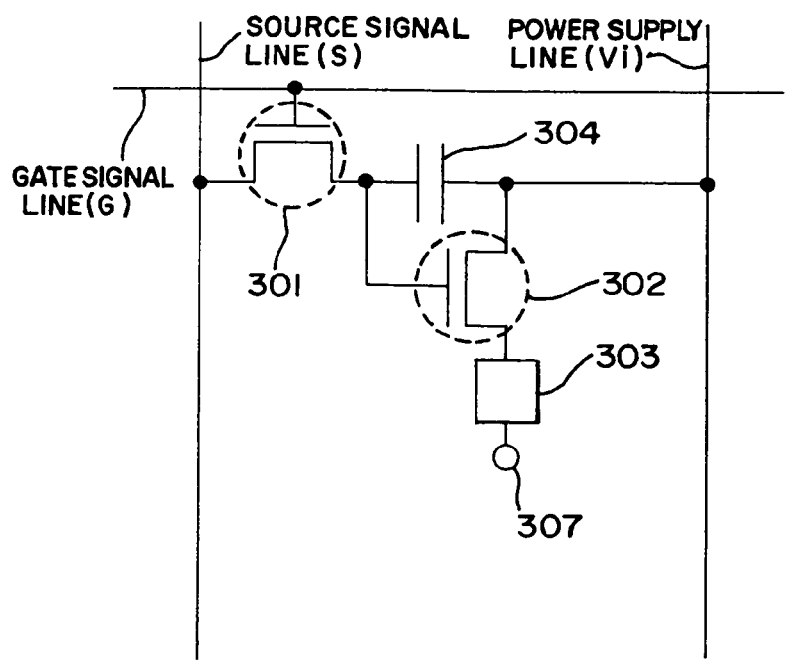
FIG. 3 is a circuit diagram of a pixel.

FIG. 3 is a circuit diagram of a pixel in the light emitting device to which the repairing method of the present invention is applied. Each pixel has a source signal line Si (i represents one of integers from 1 to x), a power supply line Vi (i represents one of integers from 1 to x), and a gate signal line Gj (j represents one of integers from 1 to y).

Each pixel also has a switching TFT 301, an EL driving TFT 302, an EL element 303, and a capacitor 304.

The switching TFT 301 has a gate electrode connected to the gate signal line Gj. The switching TFT 301 has a source region and a drain region one of which is connected to the source signal line Si and the other of which is connected to a gate electrode of the EL driving TFT 302.

The EL driving TFT 302 has a source region connected to the power supply line Vi, and has a drain region connected to one of two electrodes of the EL element 303. The other electrode of the two electrodes of the EL element 303, namely, the electrode that is not connected to the drain region of the EL driving TFT 302, is connected to an opposite power supply 307.

Of the two electrodes of the EL element 303, the one that is connected to the drain region of the EL driving TFT 302 is called a pixel electrode while the other that is connected to the opposite power supply 307 is called an opposite electrode.

The capacitor 304 is formed between the gate electrode of the EL driving TFT is 302 and the power supply line Vi.

Figure 4A:
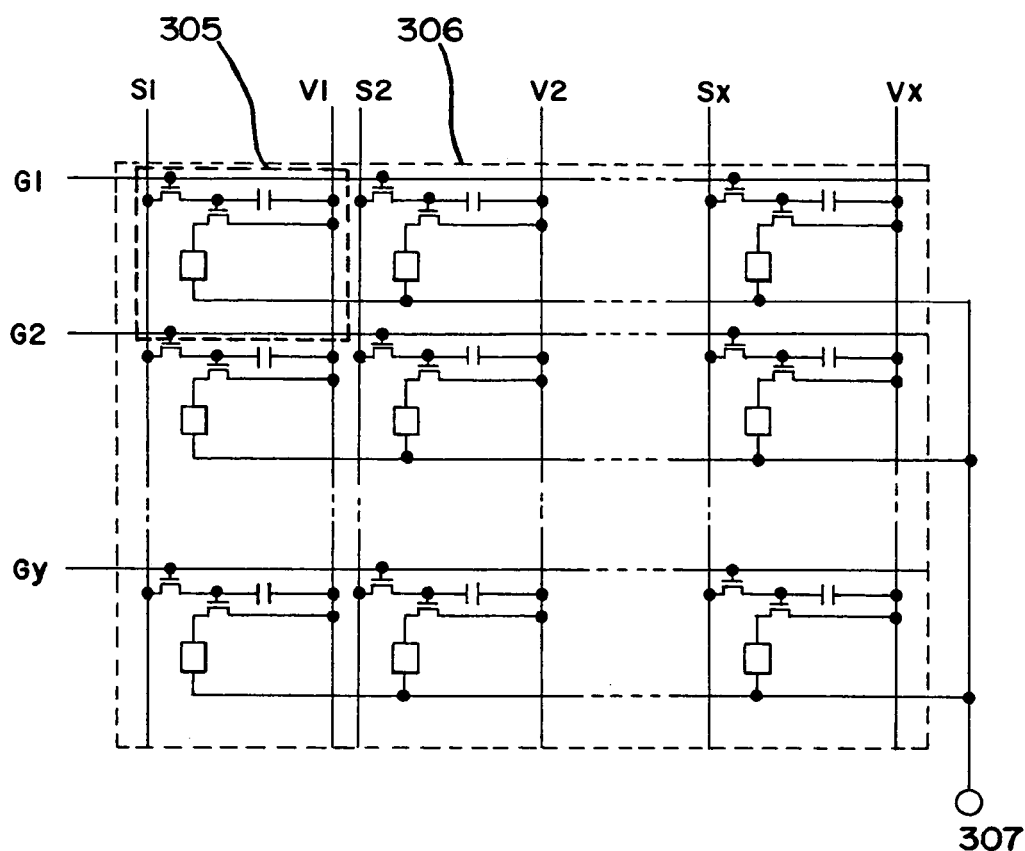
FIGS. 4A and 4B are circuit diagrams of a pixel portion and a diagram showing the operation of the pixel portion during repairing, respectively.

FIG. 4A shows a pixel portion of the light emitting device which has a plurality of pixels shown in FIG. 3. A pixel portion 306 has source signal lines S1 to Sx, power supply lines V1 to Vx, and gate signal lines G1 to Gy. The plural pixels 305 form a matrix in the pixel portion 306.

Figure 4B:
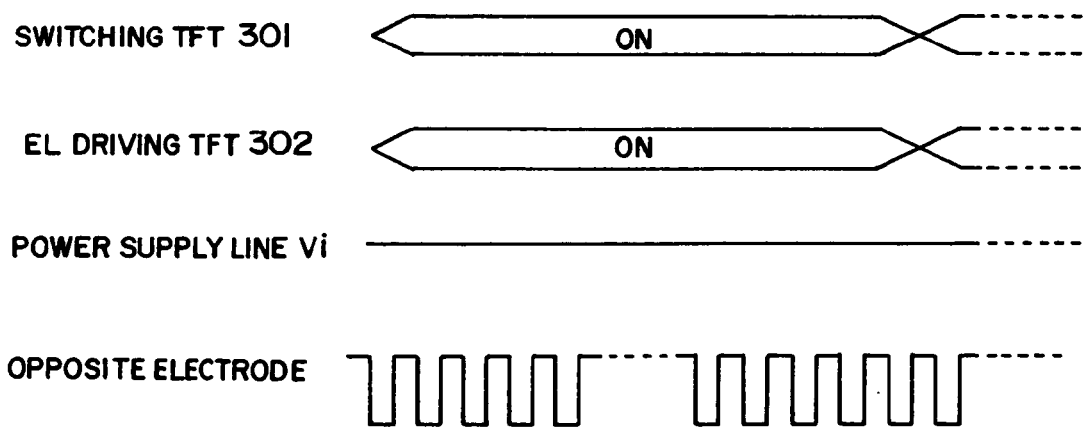

FIG. 4B shows the operation of the TFTs and the level of voltage to be inputted to the power supply line Vi and to the opposite electrode in each pixel during repairing a defect portion of the EL element 303. When the defect portion of the EL element 303 is to be repaired, the switching TFT 301 and the EL driving TFT 302 in each pixel are both turned ON. While the voltage of the power supply line Vi is kept constant. the voltage of the opposite electrode is changed at given time intervals so that a given reverse bias current flows into the EL element at given time intervals.

The defect portion of the EL element may be repaired at once in all of the pixels 305 of the pixel portion 306. Alternatively, the repair may be performed on one line of pixels at a time, or on one pixel at a time.

The method of the present invention can increase the amount of current actually flowing through the EL layer upon application of a forward bias voltage to the EL element even if a pin hole is formed in the EL layer during formation of the layer due to dusts or the like and two layers sandwiching a light emitting layer short-circuit, because the method can raise the resistance of the defect portion where the short circuit takes place by changing the defect portion into the transmuted portion. Therefore the repairing method of the present invention can raise the luminance of emitted light with application of the same level of voltage despite the presence of the defect portion.

Having high resistance $R_{SC}$, the transmuted portion hardly allows a current to flow therein in contrast to the defect portion where there is always a flow of current to accelerate degradation of a part of the EL layer that surrounds the defect portion. Therefore, degradation is not accelerated in a part of the EL layer that surrounds the transmuted portion.

Note that application of the repairing method of the present invention is not limited to light emitting devices structured as above. The present invention can be applied to light emitting devices of any structure.

[Embodiment 2]

This embodiment gives a description on a case of applying a repairing method of the present invention to an active matrix light emitting device that has three thin film transistors (TFTs) in each pixel.

Figure 5:
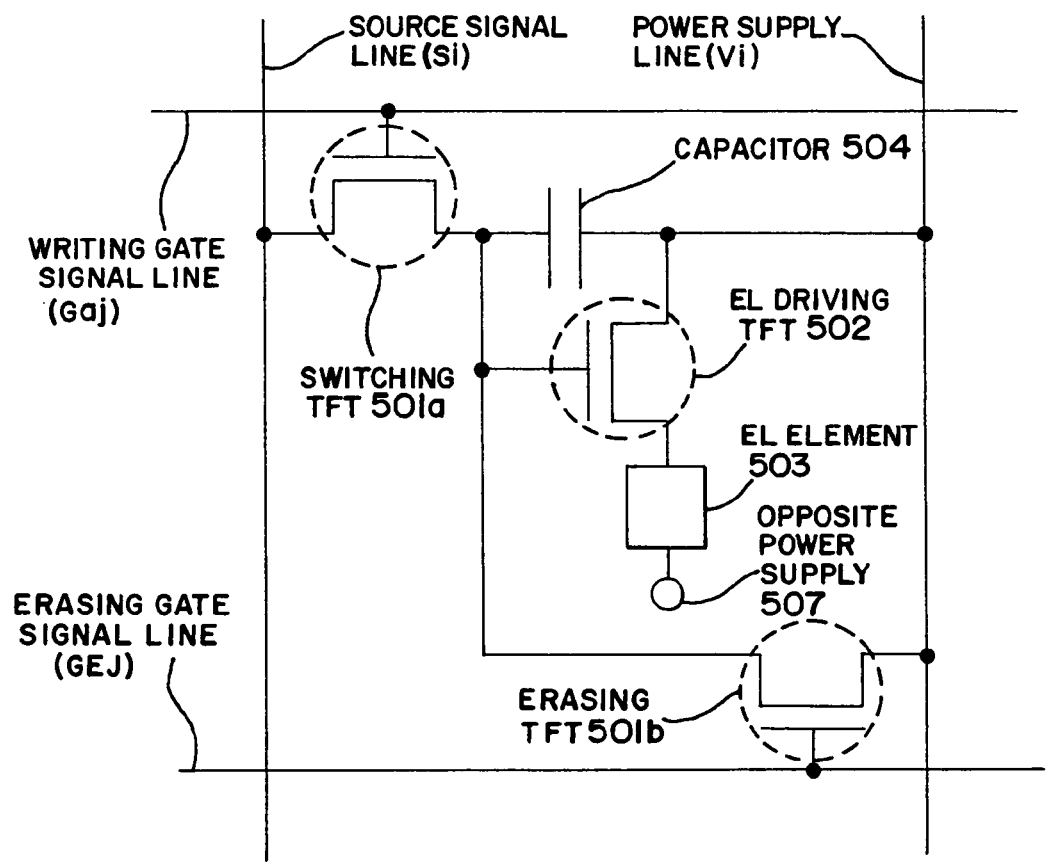
FIG. 5 is a circuit diagram of a pixel.

FIG. 5 is a circuit diagram of a pixel in the light emitting device to which the repairing method of the present invention is applied. Each pixel has a source signal line Si (i represents one of integers from 1 to x), a power supply line Vi (i represents one of integers from 1 to x), a writing gate signal line Gaj (j represents one of integers from 1 to y) and an erasing gate signal line Gej (j represents one of integers from 1 to y).

Each pixel also has a switching TFT 501a, an erasing TFT 501b, an EL driving TFT 502, an EL element 503, and a capacitor 504.

The switching TFT 501a has a gate electrode connected to the writing gate signal line Gaj. The switching TFT 501a has a source region and a drain region one of which is connected to the source signal line Si and the other of which is connected to a gate electrode of the EL driving TFT 502.

The erasing TFT 501b has a gate electrode connected to the erasing gate signal line Gej. The erasing TFT 501 has a source region and a drain region one of which is connected to the power supply line Vi and the other of which is connected to the gate electrode of the EL driving TFT 502.

The EL driving TFT 502 has a source region connected to the power supply line Vi, and has a drain region connected to one of two electrodes of the EL element 503. The other electrode of the two electrodes of the EL element 503, namely, the electrode that is not connected to the drain region of the EL driving TFT 502, is connected to an opposite power supply 507.

Of the two electrodes of the EL element 503, the one that is connected to the drain region of the EL driving TFT 502 is called a pixel electrode while the one that is connected to the opposite power supply 507 is called an opposite electrode.

The capacitor 504 is formed between the gate electrode of the EL driving TFT 502 and the power supply line Vi.

Figure 6A:
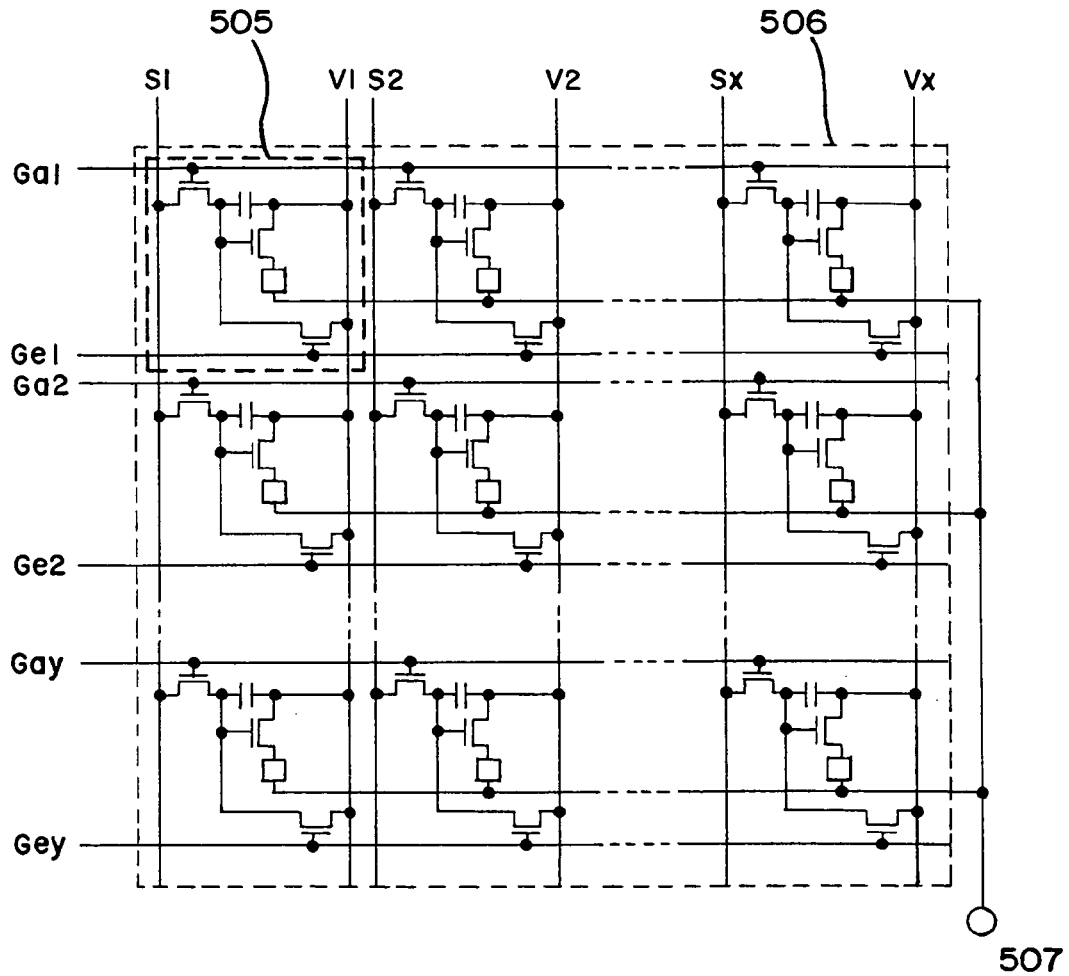
FIGS. 6A and 6B are circuit diagrams of a pixel portion and a diagram showing the operation of the pixel portion during repairing, respectively.

FIG. 6A shows a pixel portion of the light emitting device which has a plurality of pixels shown in FIG. 5. A pixel portion 506 has source signal lines S1 to Sx, power supply lines V1 to Vx, writing gate signal lines Ga1 to Gay, and erasing gate signal lines Ge1 to Gey. The plural pixels 505 form a matrix in the pixel portion 506.

Figure 6B:
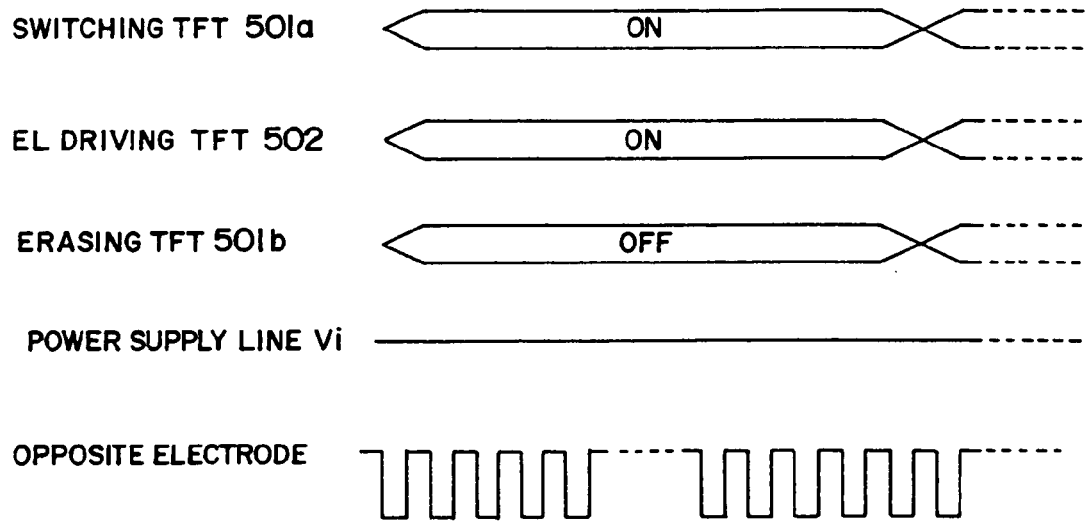

FIG. 6B shows the operation of the TFTs and the level of voltage to be inputted to the power supply line Vi and to the opposite electrode in each pixel during repairing a defect portion of the EL element 503. When the defect portion of the EL element 503 is to be repaired, the switching TFT 501a and the EL driving TFT 502 in each pixel are both turned ON. The erasing TFT 501b in each pixel is turned OFF. While the voltage of the power supply line Vi is kept constant, the voltage of the opposite electrode is changed at given time intervals so that a given reverse bias current flows into the EL element 503 at given time intervals.

The defect portion of the EL element 503 may be repaired at once in all of the pixels 505 of the pixel portion 506. Alternatively, the repair may be performed on one line of pixels at a time, or on one pixel at a time.

The method of the present invention can increase the amount of current actually flowing through the EL layer upon application of a forward bias voltage to the EL element even if a pin hole is formed in the EL layer during formation of the layer due to dusts or the like and two layers sandwiching a light emitting layer short-circuit, because the method can raise the resistance of the defect portion where the short circuit takes place by changing the defect portion into the transmuted portion. Therefore the repairing method of the present invention can raise the luminance of emitted light with application of the same level of voltage despite the presence of the defect portion.

Having high resistance $R_{SC}$, the transmuted portion hardly allows a current to flow therein in contrast to the defect portion where there is always a flow of current to accelerate degradation of a part of the EL layer that surrounds the defect portion. Therefore, degradation is not accelerated in a part of the EL layer that surrounds the transmuted portion.

[Embodiment 3]

In this embodiment, the structure of the driver circuit which is driving the pixel portion in Embodiment 1 is explained in Embodiment 1. The source signal driving circuit and the gate signal driving circuit which are driving the pixel portion in Embodiment 1 are not limited to the structure shown in this Embodiment.

Figure 7A:
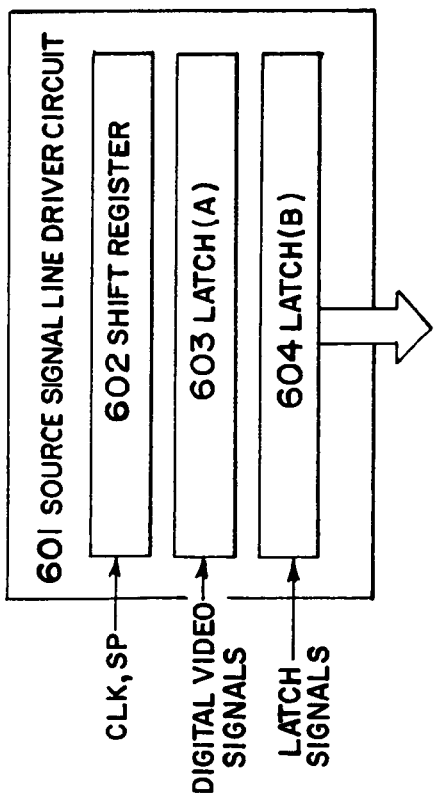
FIGS. 7A and 7B are diagrams showing the structure of driving circuits.

FIG. 7 shows a driving circuit of the light emitting device by a block figure. In FIG. 7A, the reference numeral 601 is a source signal line driver circuit which has the shift register 602, the latch (A) 603 and the latch (B) 604.

A clock signal (CLK) and a start pulse (SP) are inputted to the shift register 602 in the source signal line driving circuit 601. The shift register 602 generates timing signals in order based upon the clock signal (CLK) and the start pulse (SP), and the timing signals are supplied one after another to downstream circuits through a buffer (not shown in the figure).

Note that the timing signals from the shift register 602 may be buffer-amplified by a circuit such as a buffer. The load capacitance (parasitic capacitance) of a wiring to which the timing signals are supplied is large because many of the circuits and elements are connected to the wiring. The buffer is formed in order to prevent dullness in the rise and fall of the timing signal, generated due to the large load capacitance. In addition, the buffer is not always necessary formed.

The timing signals which is a buffer-amplified are supplied to the latch (A) 603. The latch (A) 603 has a plurality of latch stages for processing an n-bit digital signal (digital signal having an image information). The latch (A) 603 writes in and maintains an n-bit digital signal which is supplied by the external of the source signal line driver circuit 601 in order simultaneously with the input of the above-mentioned timing signals.

Note that the digital signals may be sequentially inputted to the plurality of latch stages of the latch (A) 603 when the digital signals are taken in by the latch (A) 603. However, the present invention is not limited to this structure. A so-called division drive may be performed, that is, the plurality of latch stages of the latch (A) 603 is divided into a number of groups, and then the digital signals are parallel inputted to the respective groups at the same time. Note that the number of groups at this point is called a division number. For example, if the latch circuits are grouped into 4 stages each, then it is called a 4-branch division drive.

The time necessary to complete writing of the digital signals into all the latch stages of the latch (A) 603 is called a line period. In effect, the above-defined line period added with the horizontal retrace period may also be referred to as the line period.

After the completion of one line period, a latch signal is supplied to the latch (B) 604. In this moment, the digital signals written in and held by the latch (A) 603 are sent all at once to the latch (B) 604 to be written in and held by all the latch stages thereof.

Sequential writing-in of digital signals on the basis of the timing signals from the shift register 602 is again carried out to the latch (A) 603 after it has completed sending the digital signals to the latch (B) 604.

During this second time one line period, the digital video signals written in and held by the latch (B) 603 are inputted to the source signal lines.

Figure 7B:
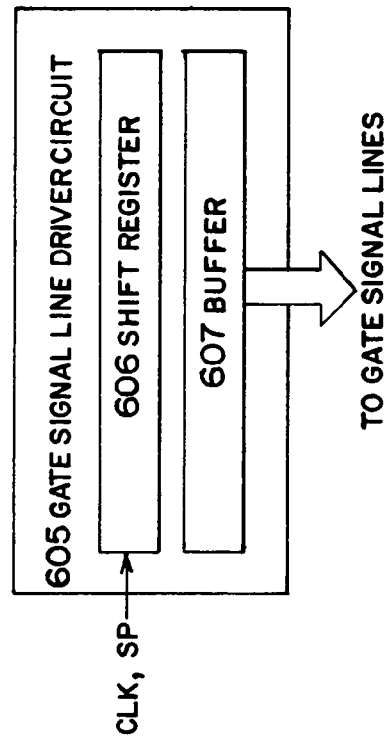

FIG. 7B is a block figure which is showing a structure of the gate signal line driver circuit.

The gate signal driver circuit 605 has a shift register 606 and a buffer 607 respectively. According to circumstances, the level shifter can be provided.

In the gate signal line driving circuit 605, the timing signal is supplied to the buffer 607 from the shift register 606, and this is supplied to a corresponding gate signal line. Gate electrodes of the switching TFTs of one line portion of pixels are connected to each of the gate signal lines. All of the switching TFTs of the one line portion of pixels must be placed in an ON state simultaneously, and therefore a buffer in which a large electric current can flow is used.

In the case that the repair method of the present invention is used, the switching TFT is in an ON state by controlling a signal inputted to the gate signal line by the gate signal line driver circuit, and the EL driver TFT is in an ON state by a digital signal inputted to the source signal line from the source signal line driver circuit.

Further, in this embodiment, the structure of the driver circuit of the pixel portion shown in Embodiment 1 is explained, but also the structure of the driver circuit of the is pixel portion shown in Embodiment 2 has the same structure. The pixel portion shown in Embodiment 2 has a two gate signal line driver circuit, and each gate signal line driver circuit has structures shown in FIG. 7B respectively. In Embodiment 2, each gate signal line driver circuit control the inputting signal to the writing gate signal line and the eraser gate signal line respectively.

[Embodiment 4]

A description given in this embodiment is of a structure of a driving circuit for driving the pixel portion of the light emitting device shown in Embodiment 1. The structure of this embodiment is different from the one described in Embodiment 3. A source signal line driving circuit and a gate signal line driving circuit for driving the pixel portion of Embodiment 1 may not necessarily have the structure shown in this embodiment.

Figure 8A:
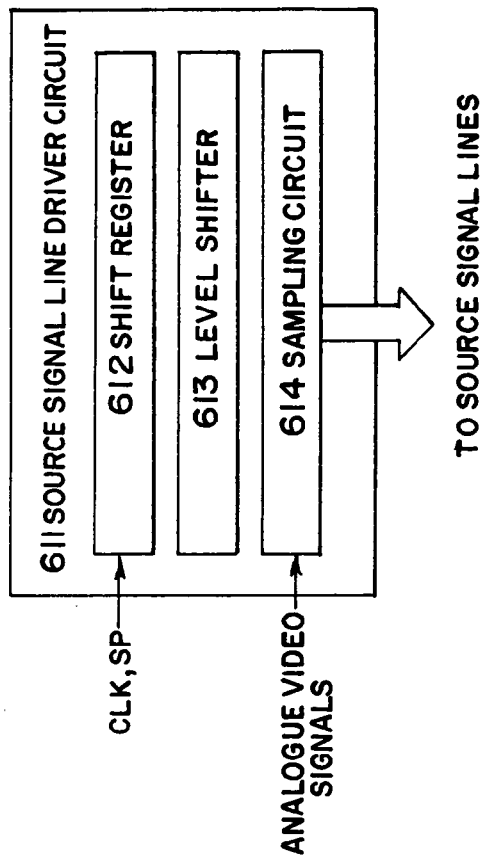
FIGS. 8A and 8B are diagrams showing the structure of driving circuits.

FIG. 8A is a circuit diagram of a source signal line driving circuit 611 according to this embodiment. Reference numeral 612 denotes a shift register; 613, a level shifter; and 614, a sampling circuit.

A clock signal (CLK) and a start pulse signal (SP) are inputted to the shift register 612. An analog signal containing image information (analog video signal) is inputted to the sampling circuit 614.

Upon input of the clock signal (CLK) and the start pulse signal (SP) in the shift register 612, a timing signal is generated and inputted to the level shifter 613. The timing signal inputted to the level shifter 613 is inputted to the sampling circuit 614 with its amplitude amplified.

Using the timing signal inputted to the sampling circuit 614, the analog video signal also inputted to the sampling circuit 614 is sampled and then inputted to the associated source signal line.

Figure 8B:
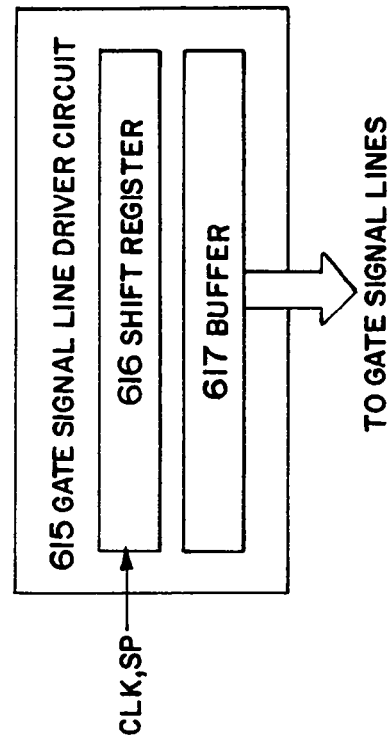

FIG. 8B is a block diagram showing the structure of a gate signal line driving circuit.

A gate signal line driving circuit 615 has a shift register 616 and a buffer 617. The circuit may also have a level shifter.

In the gate signal line driving circuit 615, a timing signal is supplied from the shift register 616 to the buffer 617, and then to the associated gate signal line. The gate signal line is connected to gate electrodes of switching TFTs in one line of pixels. Since switching TFTs in one line of pixels have to be turned ON at once, the buffer used has to be capable of flowing a large current.

When the repairing method of the present invention is used, the gate signal line driving circuit controls signals to be inputted to gate signal lines to turn switching TFTs ON whereas EL driving TFTs are turned ON by analog video signals inputted to source signal lines from the source signal line driving circuit.

[Embodiment 5]

This embodiment describes a case of applying a repairing method of the present invention to an EL element whose EL layer comprises a plurality of layers.

Figure 9A:
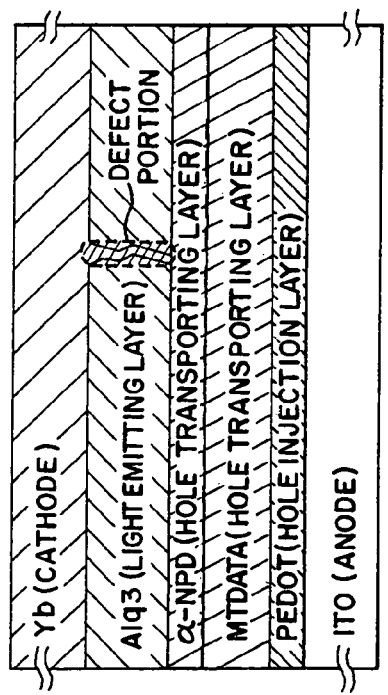
FIGS. 9A and 9B are diagrams showing the structure of EL elements.

FIG. 9A shows the structure of the EL element. First, a hole injection layer is formed by spin coating to a thickness of 30 nm from PEDOT that is a polythiophene derivative on an anode formed of a compound of indium oxide and tin oxide (ITO). Next, an MTDATA layer with a thickness of 20 nm and an α-NPD layer with a thickness of 10 nm are formed by evaporation as a hole transporting layer. On the hole transporting layer, a light emitting layer is formed of a self-luminous material, Alq$_3$, that is a singlet compound by evaporation to a thickness of 50 nm. Then a cathode is formed by depositing Yb through evaporation to a thickness of 400 nm to complete the EL element.

If a pin hole is opened and a defect portion is formed in the light emitting layer of the EL element structured as above, the Yb layer that is the cathode is undesirably brought into contact with the α-NPD layer that is the hole transporting layer in the defect portion.

When a reverse bias current is caused to flow in the EL element having the defect portion at given time intervals, the temperature in the defect portion is raised so that the defect portion is burnt out, vaporized, or oxidized or carbonized to be transformed into an insulator. As a result, the defect portion is changed into the transmuted portion to increase the resistance thereof. Therefore degradation of a part of the EL layer that surrounds the transmuted portion is not accelerated.

Light emitted from this EL element utilizes singlet excitation energy from the singlet compound.

Figure 9B:
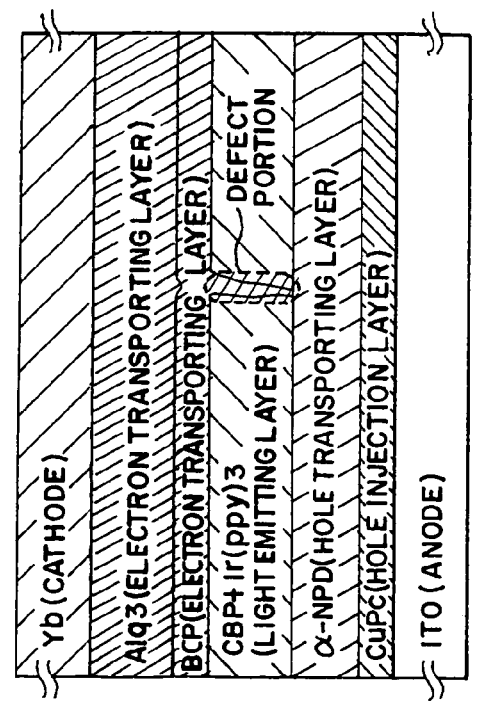

FIG. 9B shows the structure of another EL element. First, a hole injection layer is formed by evaporation to a thickness of 20 nm from copper phthalocyanine on an anode formed of a compound of indium oxide and tin oxide. Next, a hole transporting layer is formed from α-NPD by evaporation to a thickness of 10 nm. On the hole transporting layer, a light emitting layer is formed of self-luminous materials, Ir(ppy)$_3$ and CBP, that are triplet compounds by evaporation to a thickness of 20 nm. An electron transporting layer is formed on the light emitting layer by forming a BCP layer with a thickness of 10 nm and an Alq$_3$ layer with a thickness of 40 nm through evaporation. Then a cathode is formed by depositing Yb through evaporation to a thickness of 400 nm to complete the EL element.

If a pin hole is opened and a defect portion is formed in the light emitting layer of the EL element structured as above, the BCP layer that is the electron transporting layer is undesirably brought into contact with the α-NPD layer that is the hole transporting layer in the defect portion.

When a reverse bias current is caused to flow in the EL element having the defect portion at given time intervals, the temperature in the defect portion is raised so that the defect portion is burnt out, vaporized, or oxidized or carbonized to be transformed into an insulator. As a result, the defect portion is changed into the transmuted portion to increase the resistance thereof. Therefore degradation of a part of the EL layer that surrounds the transmuted portion is not accelerated.

Light emitted from this EL element utilizes triplet excitation energy from the triplet compounds.

Figure 10A:
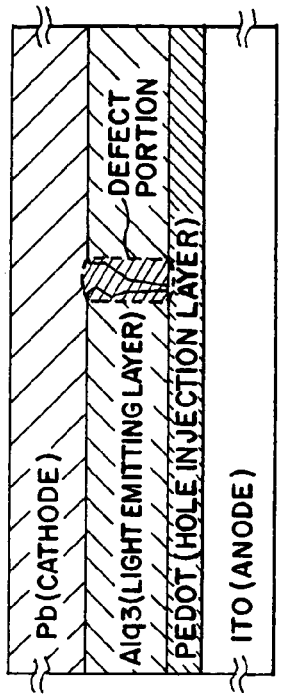
FIGS. 10A and 10B are diagrams showing the structure of EL elements.

FIG. 10A shows the structure of still another EL element. First, a hole injection layer is formed by spin coating to a thickness of 30 nm from PEDOT that is a polythiophene derivative on an anode formed of a compound of indium oxide and tin oxide (ITO). On the hole injection layer, a light emitting layer is formed of a self-luminous material, Alq$_3$, that is a singlet compound by evaporation to a thickness of 50 nm. Then a cathode is formed by depositing Pb through evaporation to a thickness of 400 nm to complete the EL element.

If a pin hole is opened and a defect portion is formed in the light emitting layer of the EL element structured as above, the Pb layer that is the cathode is undesirably brought into contact with the PEDOT layer that is the hole injection layer in the defect portion.

When a reverse bias current is caused to flow in the EL element having the defect portion at given time intervals, the temperature in the defect portion is raised so that the defect portion is burnt out, vaporized, or oxidized or carbonized to be transformed into an insulator. As a result, the defect portion is changed into the transmuted portion to increase the resistance thereof. Therefore degradation of a part of the EL layer that surrounds the transmuted portion is not accelerated.

Light emitted from this EL element utilizes singlet excitation energy from the singlet compound.

Figure 10B:
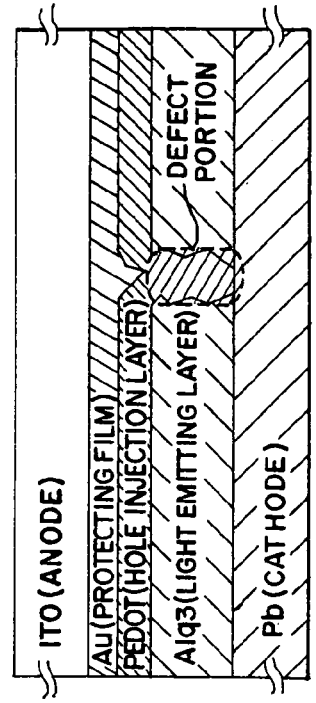

FIG. 10B shows the structure of yet still another EL element. First, a cathode is formed by evaporation from Pb to a thickness of 400 nm. On the cathode, a light emitting layer is formed of a self-luminous material, Alq$_3$, that is a singlet compound by evaporation to a thickness of 50 nm. Next, a hole injection layer is formed by spin coating to a thickness of 30 nm from PEDOT that is a polythiophene derivative. An Au film with a thickness of 5 nm is formed thereon. The Au film is provided to prevent degradation of a surface of the EL layer in later steps. Then an anode is formed on the Au film from a compound of indium oxide and tin oxide (ITO) to complete the EL element.

If a pin hole is opened and a defect portion is formed in the light emitting layer of the EL element structured as above, the Pb layer that is the cathode is undesirably brought into contact with the PEDOT layer that is the hole injection layer in the defect portion.

When a reverse bias current is caused to flow in the EL element having the defect portion at given time intervals, the temperature in the defect portion is raised so that the defect portion is burnt out, vaporized, or oxidized or carbonized to be transformed into an insulator. As a result, the defect portion is changed into the transmuted portion to increase the resistance thereof Therefore degradation of a part of the EL layer that surrounds the transmuted portion is not accelerated.

Light emitted from this EL element utilizes singlet excitation energy from the singlet compound.

With the above structure, the present invention can increase the amount of current actually flowing through the EL layer upon application of a forward bias voltage to the EL element even if a pin hole is formed in the EL layer during formation of the layer due to dusts or the like and two layers sandwiching a light emitting layer short-circuit, because the method can raise the resistance of the defect portion where the short circuit takes place by changing the defect portion into the transmuted portion. Therefore the repairing method of the present invention can raise the luminance of emitted light with application of the same level of voltage despite the presence of the defect portion.

Furthermore, the invention can prevent accelerated degradation in a part of the EL layer that surrounds the defect portion by changing the defect portion into the transmuted portion to increase the resistance thereof.

A carbide generated by carbonization of an EL material is high in insulating property and is stable as a substance. For that reason, the repairing method of the present invention is particularly effective when the defect portion is filled with an organic EL material, for example, when the defect portion is formed in an EL layer that is in contact with an EL material film.

This embodiment may be combined freely with Embodiments 1 through 4.

[Embodiment 6]

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an EL material (coumarin pigment) reported by the above article is represented as follows.

(Chemical formula 1)

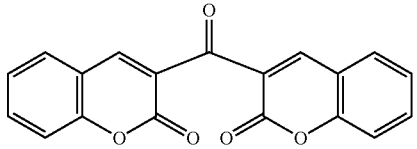

(M. A. Baldo, D. F. O'Brien, Y. You, A. Shoustikov, S. Sibley, M. E. Thompson, S. R. Forrest, Nature 395 (1998) p.151)

The molecular formula of an EL material (Pt complex) reported by the above article is represented as follows.

(Chemical formula 2)

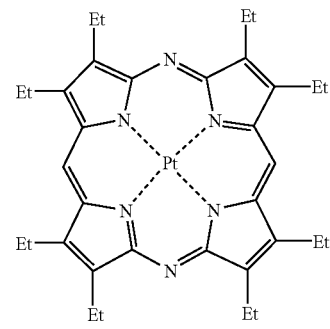

(M. A. Baldo, S. Lamansky, P. E. Burrows, M. E. Thompson, S. R. Forrest, Appl. Phys. Lett., 75 (1999) p.4.) (T. Tsutsui, M.-J. Yang, M. Yahiro, K. Nakamura. T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Chemical formula 3)

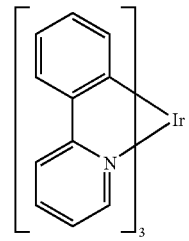

As described above, if phosphorescence from a triplet exciton can be put to practical use, it can realize the external light emitting quantum efficiency three to four times as high as that in the case of using fluorescence from a singlet exciton in principle.

The structure according to this embodiment can be freely implemented in combination of any structures of the Embodiments 1 to 5.

[Embodiment 7]

This embodiment describes the actual voltage-current characteristic of an EL element having a defect portion when a reverse bias voltage is applied to the EL element.

The EL element used in this embodiment is structured as follows. First, a hole injection layer is formed by evaporation to a thickness of 20 nm from copper phthalocyanine on an anode formed of a compound of indium oxide and tin oxide (ITO). Next, an MTDATA layer with a thickness of 20 nm and an α-NPD layer with a thickness of 10 nm are formed by evaporation as a hole transporting layer. On the hole transporting layer, a light emitting layer is formed of a self-luminous material, $Alq_3$, that is a singlet compound by evaporation to a thickness of 50 nm. An electron injection layer is formed next from lithium acetylacetonate (Liacac) to a thickness of 2 nm. Then a cathode is formed from an aluminum alloy to a thickness of 50 nm to complete the EL element.

Figure 14:
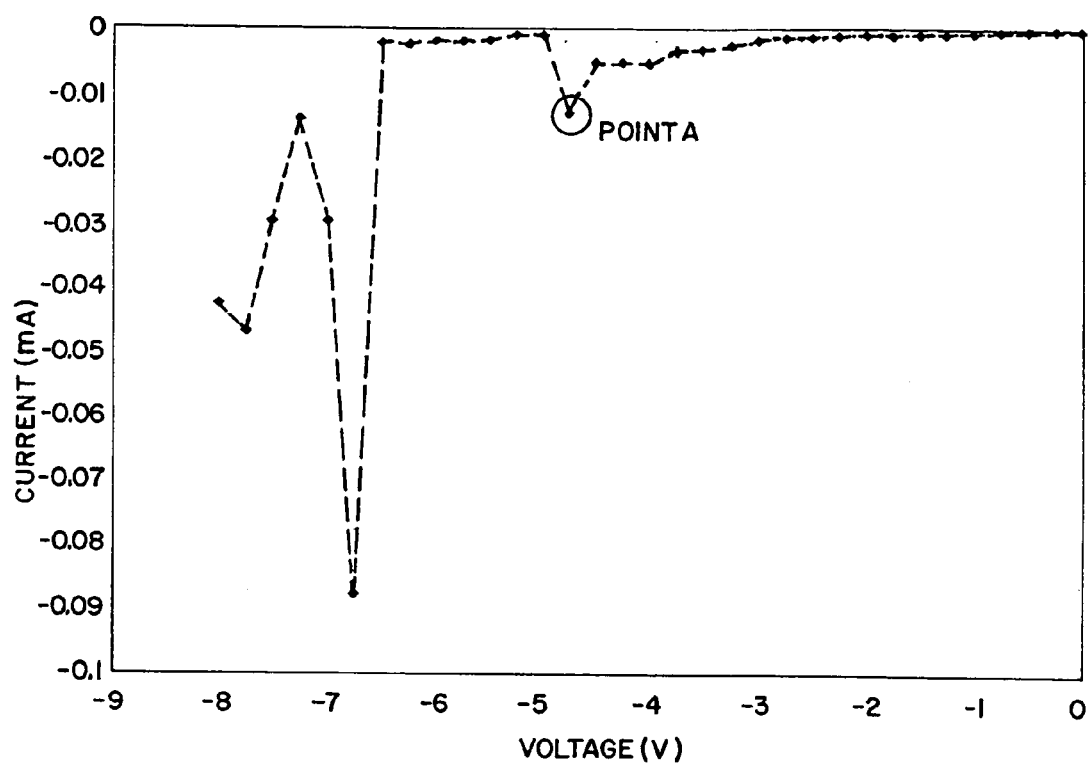
FIG. 14 is a graph showing the voltage-current characteristic of an EL element when a reverse bias current flows therein.

FIG. 14 shows the voltage-current characteristic of the EL element structured as above when a reverse bias voltage is applied to the EL element. The reverse bias current becomes larger toward Point A at which the reverse bias voltage is –5 V and declines past that point.

Despite the EL element being damaged, the reverse bias current increases, owing supposedly to application of reverse bias voltage, but declines past Point A. Therefore it can be deduced that some change in defect portion takes place at Point A to raise the resistance of the defect portion.

In the repairing method of the present invention, the level of reverse bias voltage to be applied to the EL element and voltage application time varies depending on the material of an anode, a cathode, and an EL layer of the EL element and the structure of the EL element. If the reverse bias voltage is remarkably low, effects of the present invention cannot be obtained but in as case of being remarkably high a reverse bias voltage accelerates degradation of the EL layer or damages the EL element itself.

According to the voltage-current characteristic shown in FIG. 14, the reverse bias current sharply increases with a reverse bias voltage of –6.5 V or lower. Therefore, in the case of the EL element used in this embodiment, the EL element is probably about to be damaged or the EL layer comes near to degrade when a reverse bias voltage of –6.5 or lower is applied.

The level of reverse bias voltage to be applied to the EL element and voltage application time have to be set by one who intends to carry out the present invention so as to suit the material of an anode, a cathode, and an EL layer of the EL element and the structure of the EL element.

[Embodiment 8]

This embodiment describes the voltage-current characteristic of an EL element in the case where a direct reverse bias voltage is increased until it reaches an avalanche voltage ($V_{av}$) and then decreased.

Figure 15:
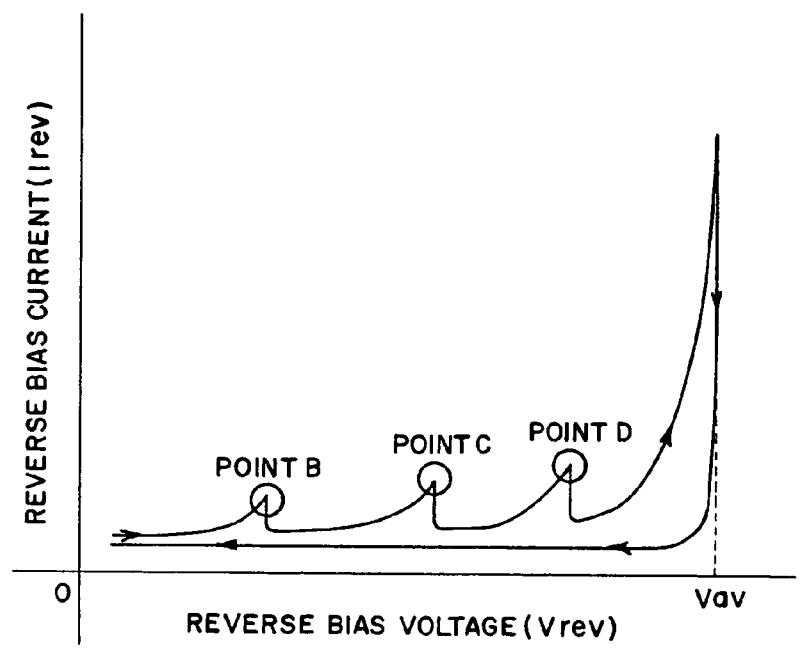
FIG. 15 is a diagram showing the voltage-current characteristic of an EL element.

FIG. 15 is a graph of the voltage-current characteristic when a direct reverse bias voltage is increased until the avalanche voltage ($V_{av}$) and then decreased. As the reverse bias voltage is increased, a reverse bias current $I_{rev}$ temporarily surges at Point B. Point C, and Point D, where some change takes place in the defect portion to transform the defect portion into the transmuted portion.

No particular change in reverse bias current $I_{rev}$ is observed as the reverse bias voltage $V_{rev}$ declines after the voltage reaches the highest at $V_{av}$.

This embodiment may be combined freely with Embodiments 1 through 7.

[Embodiment 9]

This embodiment gives descriptions on a sectional view of a light emitting device to which a repairing method of the present invention is applied.

Figures 16, 17:
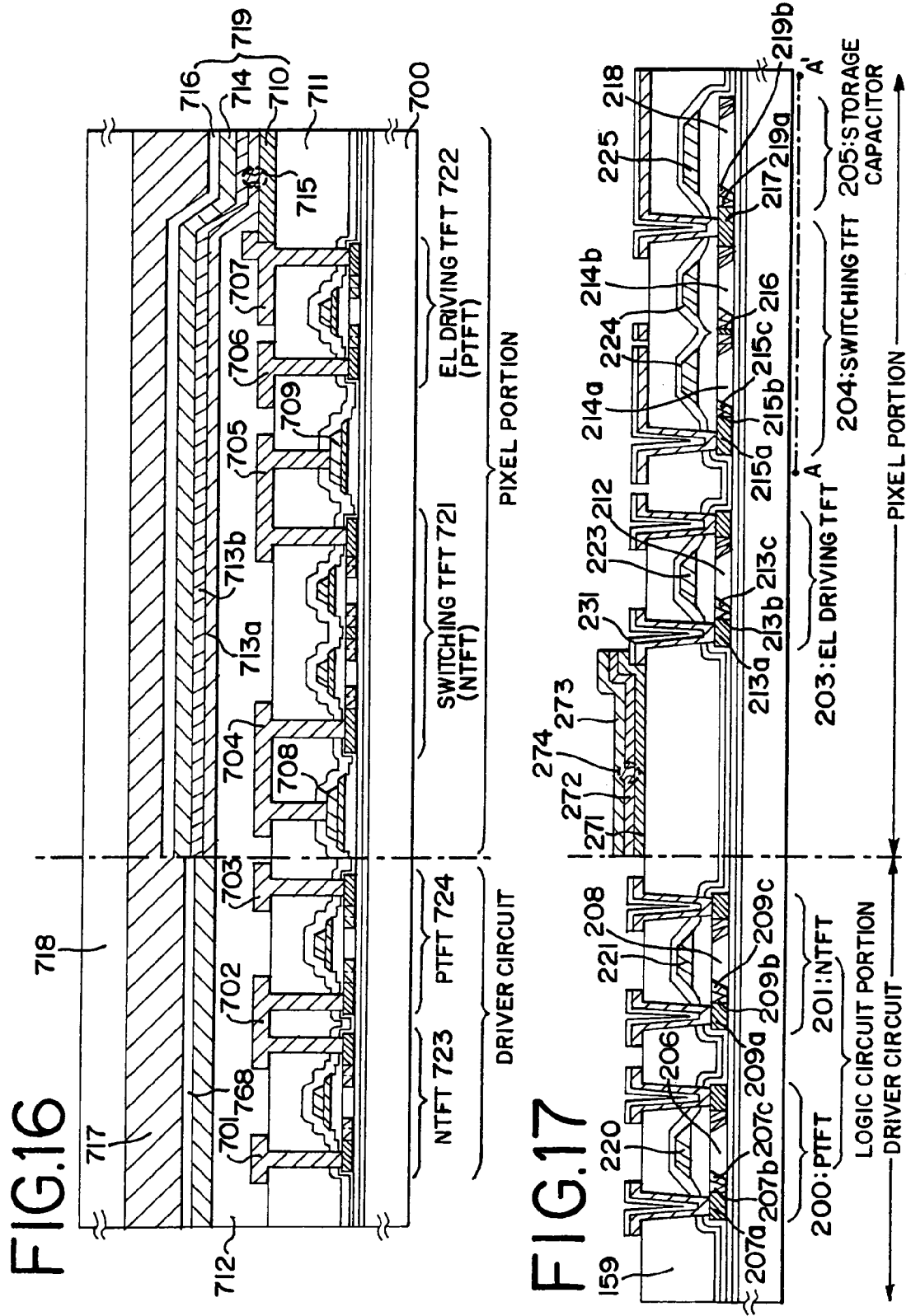
FIG. 16 is a sectional view of a light emitting device.
FIG. 17 is a sectional view of a light emitting device.

In FIG. 16, an n-channel TFT is used for a switching TFT 721 formed on a substrate 700.

The switching TFT 721 in this embodiment has a double gate structure in which two channel formation regions are formed. However, the TFT may take a single gate structure having one channel formation region or a triple gate structure having three channel formation regions.

A driving circuit formed on the substrate 700 has an n-channel TFT 723 and a p-channel TFT 724. Although the TFTs of the driving circuit are of single gate structure in this embodiment, the TFTs may take the double gate structure or the triple gate structure.

Wiring lines 701 and 703 function as source wiring lines of the CMOS circuit whereas 702 functions as a drain wiring line thereof. A wiring line 704 functions as a wiring line that electrically connects a source wiring line 708 to a source region of the switching TFT. A wiring line 705 functions as a wiring line that electrically connects a drain wiring line 709 to a drain region of the switching TFT.

A p-channel TFT is used for an EL driving TFT 722. The EL driving TFT 722 in this embodiment is of single gate structure but it may have the double gate structure or the triple gate structure.

A wiring line 706 is a source wiring line of the EL driving TFT (corresponds to a current supply line). A wiring line 707 is an electrode that is laid on a pixel electrode 710 of the EL driving TFT to be electrically connected to the pixel electrode 710.

The pixel electrode 710 is formed of a transparent conductive film and serves as an anode of an EL element. The transparent conductive film is obtained from a compound of indium oxide and tin oxide or a compound of indium oxide and zinc oxide, or from zinc oxide, tin oxide, or indium oxide alone. The transparent conductive film may be doped with gallium. The pixel electrode 710 is formed on a flat interlayer insulating film 711 before forming the above wiring lines. In this embodiment, the film 711 is a planarization film made of resin and it is very important to level the level differences caused by the TFTs with the planarization film 711. An EL layer to be formed later is so thin that the existence of level differences can cause light emission defect. Accordingly the surface has to be leveled before forming the pixel electrode so that the EL layer is formed on as flat a surface as possible.

After the wiring lines 701 to 707 are formed, a bank 712 is formed as shown in FIG. 16. The bank 712 is formed by patterning an insulating film containing silicon, or an organic resin film, which has a thickness of 100 to 400 nm.

Since the bank 712 is an insulating film, care must be taken not to cause static breakdown of the element during film formation. In this embodiment, carbon particles or metal particles are added to the insulating film that is to serve as the material of the bank 712, thereby reducing the resistivity and thus avoiding generation of electrostatic. The amount of carbon particles or metal particles to be added is adjusted such that the resistivity is reduced to $1 \times 10^6$ to $1 \times 10^{12}$ Ωm (preferably $1 \times 10^8$ to $1 \times 10^{10}$ Ωm).

An EL layer 713 is formed on the pixel electrode 710. Although only one pixel is shown in FIG. 16, formed in this embodiment are EL layers for red light (R), EL layers for green light (G), and EL layers for blue light (B). This embodiment uses for the EL layer 713 a low molecular weight organic EL material, which is formed into a film by evaporation. Specifically, the EL layer 713 has a laminate structure in which a copper phthalocyanine (CuPc) film with a thickness of 20 nm is formed as a hole injection layer 713a and a tris-8-quinolinolate aluminum complex ($Alq_3$) film with a thickness of 70 nm is formed as a light emitting layer 713b on the hole injection layer. The color of emitted light can be controlled by choosing which fluorescent pigment, such as quinacridon, perylene, or DCM1, is used to dope $Alq_3$.

The material given in the above is merely an example of organic EL materials that can be used for the EL layer and there is no need to be limited thereto. The EL layer (meaning a layer for light emission and for carrier transportation to emit light) may have a charge carrier transporting layer or a charge carrier injection layer, or both, in addition to the light emitting layer. For instance, a high molecular weight organic EL material may be employed for the EL layer though used in the example shown in this embodiment is a low molecular weight organic EL material. Inorganic materials such as silicon carbide may be used for the charge carrier transporting layer and the charge carrier injection layer. Known organic EL materials and known inorganic materials can be used.

On the EL layer 713, a cathode 714 is formed from a conductive film. In this embodiment, an alloy film of aluminum and lithium is used as the conductive film. A known MgAg film (an alloy film of magnesium and silver) may of course be used. An appropriate cathode material is a conductive film made of an element belonging to Group 1 or 2 in the periodic table, or a conductive film doped with a Group 1 or 2 element.

Formation of the cathode 714 completes an EL element 719. The EL element 719 here means a capacitor comprising the pixel electrode (anode) 710, the EL layer 713, and the cathode 714.

It is effective to provide a passivation film 716 so as to cover the EL element 719 completely. The passivation film 716 is an insulating film, examples of which include a carbon film, a silicon nitride film, and a silicon oxynitride film. A single layer or a laminate of these insulating films is used for the passivation film.

It is preferable to use as the passivation film a film that can cover a wide area. A carbon film, a DLC (diamond-like carbon) film, in particular, is effective. The DLC film can be formed in a temperature range between room temperature and 100° C., and therefore is easy to form above the EL layer 713 that has a low heat resistance. Furthermore, the DLC film is highly effective in blocking oxygen and can prevent oxidization of the EL layer 713. Therefore the EL layer 713 can be saved from being oxidized before a sealing step to be carried out subsequently.

A seal 717 is provided on the passivation film 716 and a cover member 718 is bonded. A UV-curable resin can be used as the seal 717. It is effective to place a substance having a hygroscopic effect or a substance having an anti-oxidizing effect inside the seal 717. The cover member 718 used in this embodiment is a glass substrate, a quartz substrate, or a plastic substrate (including a plastic film) with carbon films (preferably diamond-like carbon films) formed on its front and back.

Thus completed is an EL display device structured as shown in FIG. 16. It is effective to use a multi-chamber type (or in-line type) film forming apparatus to successively process the steps subsequent to formation of the bank 712 up through formation of the passivation film 716 without exposing the device to the air. The successive processing for avoiding exposure to the air may further be extended to include the step of bonding the cover member 718.

The TFTs in this embodiment are each characterized in that: a gate electrode is formed from a conductive film having two layers; almost no difference in concentration is found between low concentration impurity regions that are formed between a channel formation region and a drain region, thereby forming a gentle concentration gradient; and the low concentration impurity regions are classified into one that overlaps with the underlying gate electrode (this one is called a GOLD region) and one that does not overlap the gate electrode (this one is called an LDD region). The edges of a gate insulating film, namely, a region above the region that does not overlap the gate electrode and above a high concentration impurity region are tapered.

In the light emitting device of this embodiment, if there is a pin hole in the light emitting layer 713b, it causes a defect portion where the hole injection layer 713a and the cathode 714 are brought into contact through the pin hole. The defect portion can be changed into a transmuted portion 715 by the repairing method of the present invention, resulting in a raise in resistance. Therefore the other part of the pixel than the pin hole can have increased luminance and degradation of apart of the EL layer that surrounds the pin hole is not accelerated.

This embodiment shows the structure of the pixel portion and of the driving circuit only. However, the manufacturing process according to this embodiment can also form logic circuits such as a signal divider circuit, a D/A converter, an operation amplifier, and a γ correction circuit on the same insulator which holds the pixel portion and the driving circuit. Additionally a memory and a microprocessor may be formed.

The structure of this embodiment can be combined with any of Embodiments 1, 2, 3, 4, 6, and 8.

[Embodiment 10]

This embodiment gives descriptions on a sectional view of a light emitting device to which a repairing method of the present invention is applied.

In FIG. 17, a p-channel TFT 200 and an n-channel TFT 201 of a driving circuit are formed on the same substrate on which an EL driving TFT 203, a switching TFT 204, and a capacitor storage 205 are formed to constitute a pixel portion.

The p-channel TFT 200 of the driving circuit is comprised of: a conductive layer 220 having a second taper shape and functioning as a gate electrode; a channel formation region 206; a third impurity region 207a to function as a source region or a drain region; a fourth impurity region (A) 207b serving as an LDD region that does not overlap the gate electrode 220; and a fourth impurity region (B) 207c serving as an LDD region that partially overlaps the gate electrode 220.

The n-channel TFT 201 of the driving circuit is comprised of: a conductive layer 221 having a second taper shape and functioning as a gate electrode; a channel formation region 208; a first impurity region 209a to function as a source region or a drain region; a second impurity region (A) 209b serving as an LDD region that does not overlap the gate electrode 221; and a second impurity region (B) 209c serving as an LDD region that partially overlaps the gate electrode 221. While the channel length is 2 to 7 µm, the length of a portion where the second impurity region (B) 209c overlaps the gate electrode 221 is set to 0.1 to 0.3 µm. The length of this $L_{OV}$ region is controlled by adjusting the thickness of the gate electrode 221 and the angle of the tapered portion. With this LDD region formed in the n-channel TFT, the high electric field generated in the vicinity of the drain region is eased to prevent creation of hot carriers and thus prevent degradation of the TFT.

Similarly, the EL driving TFT 203 is comprised of: a conductive layer 223 having a second taper shape and functioning as a gate electrode; a channel formation region 212; a third impurity region 213a to function as a source region or a drain region; a fourth impurity region (A) 213b serving as an LDD region that does not overlap the gate electrode 223; and a fourth impurity region (B) 213c serving as an LDD region that partially overlaps the gate electrode 223.

Logic circuits such as a shift register circuit and a buffer circuit, and a sampling circuit having an analog switch constitute the driving circuit. In FIG. 17, the TFTs of these circuits have a single gate structure in which one gate electrode is placed between a source and a drain that form a pair. However, the TFTs may have a multi-gate structure in which a plurality of electrodes are placed between the source and the drain that form a pair.

The drain region of the EL driving TFT 203 is connected to a pixel electrode 271 through a wiring line 231. An EL layer 272 is formed from a known organic EL material so as to contact with the pixel electrode 271. A cathode 273 is formed so as to contact with the EL layer 272.

The switching TFT 204 is comprised of: a conductive layer 224 having a second taper shape and functioning as a gate electrode; channel formation regions 214a and 214b; first impurity regions 215a and 217 to function as source regions or drain regions; a second impurity region (A) 215b serving as an LDD region that does not overlap the gate electrode 224; and a second impurity region (B) 215c serving as an LDD region that partially overlaps the gate electrode 224. The length of a portion where the second impurity region (B) 215c overlaps the gate electrode 224 is set to 0.1 to 0.3 µm. The capacitor storage is comprised of: a semiconductor layer extended from the first impurity region 217 and having a second impurity region (A) 219b, a second impurity region (B) 219c, and a region 218 that is not doped with any impurity element for setting the conductivity type of the region; an insulating layer of the same layer as a gate insulating film having a third shape; and a capacitor wiring line 225 that is formed form a conductive layer having a second taper shape.

In the light emitting device of this embodiment, if there is a pin hole in the EL layer 272, it causes a defect portion where the pixel electrode 271 and the cathode 273 are brought into contact through the pin hole. The defect portion can be changed into a transmuted portion 274 by the repairing method of the present invention, resulting in a raise in resistance. Therefore the other part of the pixel than the pin hole can have increased luminance and degradation of a part of the EL layer that surrounds the pin hole is not accelerated.

The structure of this embodiment can be combined with any of Embodiments 1, 2, 3, 4, 6, and 8.

[Embodiment 11]

An outline of a cross sectional structure of a light emitting display using the repair method of the present invention is explained in this embodiment.

Figure 18:
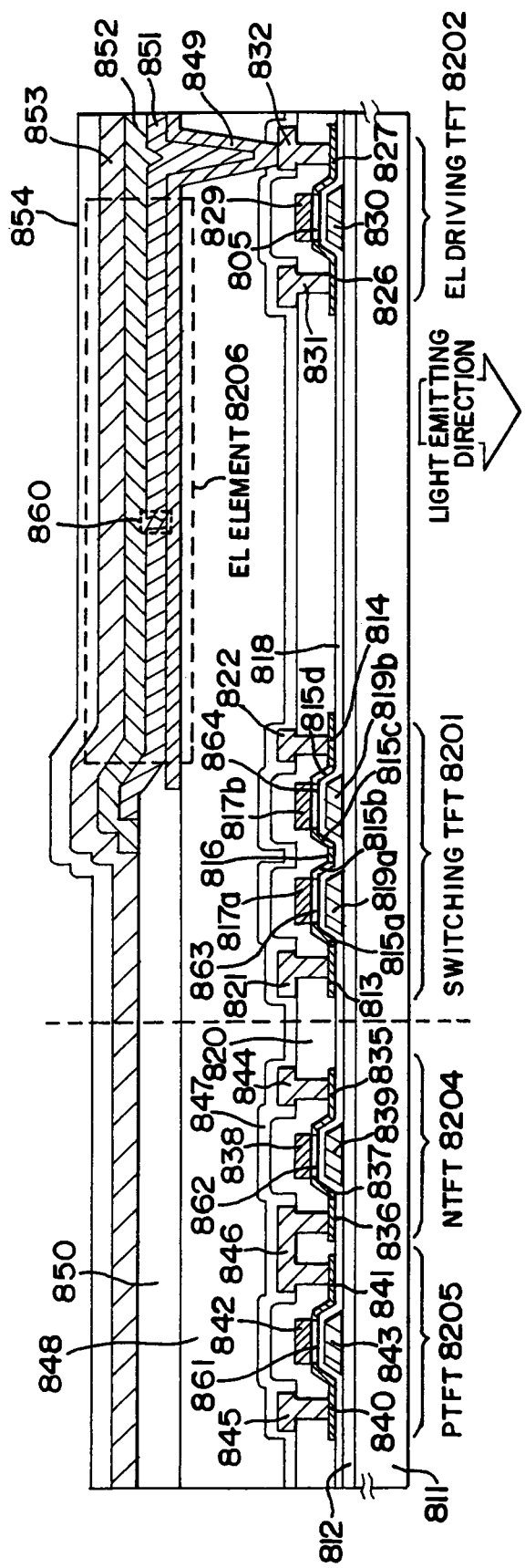
FIG. 18 is a sectional view of a light emitting device.

Reference numeral 811 denotes a substrate in FIG. 18, and reference numeral 812 denotes an insulating film which becomes a base (hereafter referred to as a base film). A light transmitting substrate, typically a glass substrate, a quartz substrate, a glass ceramic substrate, or a crystalline glass substrate can be used as the substrate 811. However, the substrate used must be one able to withstand the highest process temperature during the manufacturing processes.

Further, the base film 812 is particularly effective when using a substrate containing mobile ions or a substrate which has conductivity, but the base film 812 need not be formed on a quartz substrate. An insulating film containing silicon may be used as the base film 812. Note that the term insulating film containing silicon specifically indicates an insulating film such as a silicon oxide film, a silicon nitride film, and a silicon oxynitride film (denoted as SiOxNy, where x and y are arbitrary integers) containing oxygen or nitrogen at predetermined ratios with respect to silicon.

Reference numeral 8201 denotes a switching TFT, reference numeral 8202 denotes an EL driver TFT, and both are formed by n-channel TFT and p-channel TFTs respectively. When the direction of EL light emitted is toward the substrate lower side (surface where TFTs and the EL layer are not formed), the above structure is preferable. However, the present invention is not limited to this structure. The switching TFT and the EL driver TFT may be either n-channel TFTs or p-channel TFTs.

The switching TFT 8201 has an active layer containing a source region 813, a drain region 814, LDD regions 815a to 815d, a separation region 816, and an active layer including channel forming regions 863 and 864, a gate insulating film 818, gate electrodes 819a and 819b, a first interlayer insulating film 820, a source signal line 821 and a drain wiring 822. Note that the gate insulating film 818 and the first interlayer insulating film 820 may be common among all TFTs on the substrate, or may differ depending upon the circuit or the element. In addition, the reference numeral 817a and 817b are masks to form the channel forming region.

Furthermore, the switching TFT 8201 shown in FIG. 18 is electrically connected to the gate electrodes 819a and 819b, becoming namely a double gate structure. Not only the double gate structure, but also a multi-gate structure (a structure containing an active layer having two or more channel forming regions connected in series) such as a triple gate structure, may of course also be used.

The multi-gate structure is extremely effective in reducing the off current, and provided that the off current of the switching TFT is sufficiently lowered, a capacitor connected to the gate electrode of the first EL driver TFT 8202 can be have its capacitance reduced to the minimum necessary. Namely, the surface area of the capacitor can be made smaller, and therefore using the multi-gate structure is also effective in expanding the effective light emitting surface area of the EL elements.

In addition, the LDD regions 815a to 815d are formed so as not to overlap the gate electrodes 819a and 819b through the gate insulating film 818 in the switching TFT 8201. This type of structure is extremely effective in reducing the off current. Furthermore, the length (width) of the LDD regions 815a to 815d may be set from 0.5 to 3.5 µm, typically between 2.0 and 2.5 µm.

Note that forming an offset region (a region which is a semiconductor layer having the same composition as the channel forming region and to which the gate voltage is not applied) between the channel forming region and the LDD region is additionally preferable in that the off current is lowered. Further, when using a multi-gate structure having two or more gate electrodes, the separation region 816 (a region to which the same impurity element, at the same concentration, as that added to the source region or the drain region, is added) is effective in reducing the off current.

Next, the first EL driver TFT 8202 is formed having an active layer containing a source region 826, a drain region 827, and a channel forming region 805; the gate insulating film 818; a gate electrode 830, the first interlayer insulating film 820; a source wiring 831; and a drain wiring 832. The first EL driver TFT 8202 is a p-channel TFT in Embodiment 11. The reference numeral 829 is a mask to form the channel forming region.

Further, the drain region 814 of the switching TFT 8201 is connected to the gate electrode 830 of the EL driver TFT 8202. Although not shown in the figure, specifically the gate electrode 830 of the EL driver TFT 8202 is electrically connected to the drain region 814 of the switching TFT 8201 through the drain wiring (also referred to as a connection wiring) 822. The source wiring 831 of the first EL driver TFT 8202 is connected to an power source supply line (not shown in the figure).

The first EL driver TFT 8202 is an element for controlling the amount of electric current injected to the EL element, and a relatively large amount of current flows. It is therefore preferable to design the channel width W to be larger than the channel width of the switching TFT. Further, it is preferable to design the channel length L such that an excess of electric current does not flow in the EL driver TFT 8202. It is preferable to have from 0.5 to 2 µA (more preferably between 1 and 1.5 µA) per pixel.

In addition, by making the film thickness of the active layers (particularly the channel forming region) of the EL driver TFT 8202 thicker (preferably from 50 to 100 nm. even is better between 60 and 80 nm), deterioration of the TFT may be suppressed. Conversely, it is also effective to make the film thickness of the active layer (particularly the channel forming region) thinner (preferably from 20 to 50 nm, even better between 25 and 40 nm), from the standpoint of making the off current smaller, for the case of the switching TFT 8201.

The structures of the TFTs formed within the pixel are explained above, but a driver circuit is also formed simultaneously at this point. A CMOS circuit which becomes a basic unit for forming the driver circuit is shown in FIG. 18.

A TFT having a structure in which hot carrier injection is reduced without an excessive drop in the operating speed is used as an n-channel TFT 8204 of the CMOS circuit in FIG. 18. Note that the term driver circuit indicates a source signal line driver circuit and a gate signal line driver circuit here. It is also possible to form other logic circuit (such as a level shifter, an A/D converter, and a signal division circuit).

An active layer of the n-channel TFT 8204 of the CMOS circuit contains a source region 835, a drain region 836, an LDD region 837, and a channel forming region 862. The LDD region 837 overlaps with a gate electrode 839 through the gate insulating film 818. Therefore, the LDD region 837 is made to overlap with the gate electrode completely. It is preferable to reduce the resistance component as much as possible. The reference numeral 838 is a mask to form the channel formation region.

Formation of the LDD region 837 on only the drain region 836 side is so as not to have drop the operating speed. Further, it is not necessary to be very concerned about the off current with the n-channel TFT 8204, and it is good to place more importance on the operating speed. Thus, it is desirable that the LDD region 837 is made to completely overlap the gate electrode to decrease a resistance component to a minimum. It is therefore preferable to eliminate so-called offset.

Furthermore, there is almost no need to be concerned with degradation of a p-channel TFT 8205 of the CMOS circuit, due to hot carrier injection, and therefore no LDD region need be formed in particular. Its active layer therefore contains a source region 840, a drain region 841, and a channel forming region 861, and a gate insulating film 818 and a gate electrode 843 are formed on the active layer. It is also possible, of course, to take measures against hot carrier injection by forming an LDD region similar to that of the n-channel TFT 8204. The reference numeral 842 is a mask to form the channel formation region.

Further, the n-channel TFT 8204 and the p-channel TFT 8205 have source wirings 844 and 845 respectively, on their source regions, through the first interlayer insulating film 820. In addition, the drain regions of the n-channel TFT 8204 and the p-channel TFT 8205 are mutually connected electrically by a drain wiring 846.

Next, reference numeral 847 denotes a first passivation film, and its film thickness may be set from 10 nm to 1 µm (preferably between 200 and 500 nm). An insulating film containing silicon (in particular, it is preferable to use an oxidized silicon nitride film or a silicon nitride film) can be used as the passivation film material. The passivation film 847 possesses a role of protecting the TFTs from alkaline metals and moisture. Alkaline metals such as sodium are contained in an EL layer formed last on the final TFT (in particular, the EL driver TFT). In other words, the first passivation film 847 works as a protecting layer so that these alkaline metals (mobile ions) do not penetrate into the TFT.

Further, reference numeral 848 denotes a second interlayer insulating film, which has a function as a leveling film for performing leveling of a step due to the TFTs. An organic resin film is preferable as the second interlayer insulating film 848, and one such as polyimide, polyamide, acrylic, or BCB (benzocyclobutene) may be used. These organic resin films have the advantages of easily forming a good, level surface, having a low specific dielectric constant. The EL layer is extremely sensitive to unevenness, and therefore it is preferable to mostly absorb the TFT step by the second interlayer insulating film 848. In addition, it is preferable to form the low specific dielectric constant material thickly in order to reduce the parasitic capacitance formed between the gate signal wiring, the data signal wiring and the cathode of the EL element. The thickness, therefore, is preferably from 0.5 to 5 µm (more preferably between 1.5 and 2.5 µm).

Further, reference numeral 849 denotes a pixel electrode (EL element anode) made from a transparent conducting film. After forming a contact hole (opening) in the second interlayer insulating film 848 and in the first passivation film 847, the pixel electrode 849 is formed so as to be connected to the drain wiring 832 of the first EL driver TFT 8202. Note that if the pixel electrode 849 and the drain region 827 are formed so as not to be directly connected, as in FIG. 18, then alkaline metals of the EL layer can be prevented from entering the active layer via the pixel electrode.

A third interlayer insulating film 850 is formed on the pixel electrode 849 from a silicon oxide film, a silicon oxynitride film, or an organic resin film, with a thickness of from 0.3 to 1 μm. An open portion is formed in the third interlayer insulating film 850 over the pixel electrode 849 by etching, and the edge of the open portion is etched so as to become a tapered shape. The taper angle may be set from 10 to 60°, (preferably between 30 and 50°).

An EL layer 851 is formed on the third interlayer insulating film 850. A single layer structure or a lamination structure can be used for the EL layer 851, but the lamination structure has a better light emitting efficiency. In general, a hole injecting layer, a hole transporting layer, a light emitting layer, and an electron transporting layer are formed in order on the pixel electrode, but a structure having a hole transporting layer, a light emitting layer, and an electron transporting layer, or a structure having a hole injecting layer, a hole transporting layer, a light emitting layer, an electron transporting layer, and an electron injecting layer may also be used. Any known structure may be used by the present invention, and doping of such as a fluorescing pigment into the EL layer may also be performed.

The structure of FIG. 18 is an example of a case of forming three types of EL elements corresponding to R, G, and B. Note that although only one pixel is shown in FIG. 18, pixels having an identical structure are formed corresponding to red, green and blue colors, respectively, and that color display can thus be performed. It is possible to implement the present invention without concern as to the method of color display.

A cathode 852 of the EL element is formed on the EL layer 851 as a counter electrode. A material containing a low work coefficient material such as magnesium (Mg), lithium (Li). or calcium (Ca), is used as the cathode 852. Preferably, an electrode made from MgAg (a material made from Mg and Ag at a mixture of Mg:Ag=10:1) is used. In addition, a MgAgAl electrode, an LiAl electrode, and an LiFAl electrode can be given as other examples.

The lamination body comprising the EL layer 851 must be formed separately for each pixel, but the EL layer 851 is extremely weak with respect to moisture, and consequently a normal photolithography technique cannot be used. It is therefore preferable to use a physical mask material such as a metal mask, and to selectively form the layers by a gas phase method such as vacuum evaporation, sputtering, or plasma CVD.

The EL element 8206 is formed by the pixel electrode (anode) 849, the EL layer 851 and the cathode 852.

Note that it is also possible to use a method such as ink jet printing, screen printing or spin coating as the method of selectively forming the EL layer. However, the cathode cannot be formed in succession with these methods at present, and therefore it is preferable to use the other methods stated above.

Further, reference numeral 853 denotes a protecting electrode, which protects the EL layer and the cathode 852 from external moisture and the like at the same time is an electrode for connecting to the cathode 852 of each pixel. It is preferable to use a low resistance material containing aluminum (Al), copper (Cu), or silver (Ag) as the protecting electrode 853. The protecting electrode 853 can also be expected to have a heat radiating effect which relieves the amount of heat generated by the EL layer.

Reference numeral 854 denotes a second passivation film, which may be formed with a film thickness of 10 nm to 1 μm (preferably between 200 and 500 nm). The aim of forming the second passivation film 854 is mainly for protecting the EL layer 851 from moisture. but it is also effective to give the second passivation film 854 a heat radiating effect. Note that the EL layer is weak with respect to heat, as stated above, and therefore it is preferable to perform film formation at as low a temperature as possible (preferably within a temperature range from room temperature to 120° C.). Plasma CVD, sputtering, vacuum evaporation, ion plating, and solution coating (spin coating) can therefore be considered as preferable film formation methods.

Note that it goes without saying that all of the TFTs shown in FIG. 18 may have a polysilicon film as their active layer in the present invention.

When the pinhole is formed in the EL layer 860 in the light emitting device, the defective portion that the pixel electrode 849 and the cathode 852 are connecting through the pinhole is formed. By the repair method of the present invention, resistance can be higher by changing the defective portion to the denatured portion 860. Therefore, the brightness in the portion other than the pinhole of the pixel are raised, and the deterioration of the EL layer surrounding of the pinhole can be prevented the promotion.

Note that it is possible to implement Embodiment 11 combination with Embodiments 1 to 4, 6 and 8.

[Embodiment 12]

A light emitting device using an EL element is self-luminous and therefore is superior in visibility in bright surroundings compared to liquid crystal display devices and has wider viewing angle. Accordingly, it can be used for display units of various electric equipment.

Given as examples of electric equipment employing a light emitting device to which a repairing method of the present invention is applied are: a video camera; a digital camera; a goggle type display (head mounted display); a navigation system; an audio reproducing device (car audio, an audio component, and the like); a notebook computer; a game machine; a portable information terminal (a mobile computer, a cellular phone, a portable game machine, an electronic book, etc.); and an image reproducing device (specifically, a device capable of processing data in a recording medium such as a digital versatile disk (DVD) and having a display device that can display the image of the data). The light emitting device having an EL element is desirable particularly for a portable information terminal since its screen is often viewed obliquely and is required to have a wide viewing angle. Specific examples of the electric equipment are shown in FIGS. 11A to 11H.

Figure 11A:
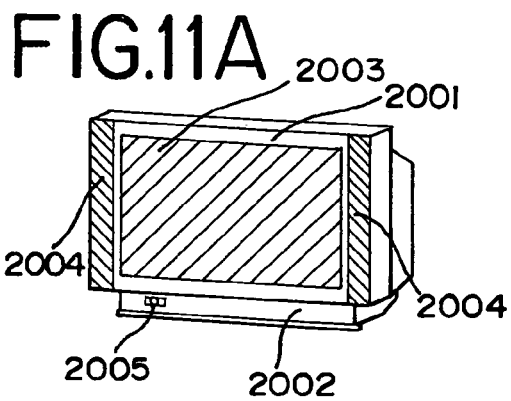
FIGS. 11A to 11H are diagrams showing electric equipment having light emitting devices to which a repairing method of the present invention is applied.

FIG. 11A shows an EL display device, which comprises a casing 2001, a supporting base 2002, a display unit 2003, speaker units 2004, a video input terminal 2005, etc. The light emitting device to which the repairing method of the present invention is applied can be used for the display unit 2003. The light emitting device having an EL element is self-luminous and does not need a backlight, so that it can make a thinner display unit than liquid display devices can. The term EL display device includes every display device for displaying information such as one for a personal computer, one for receiving TV broadcasting, and one for advertisement.

Figure 11B:
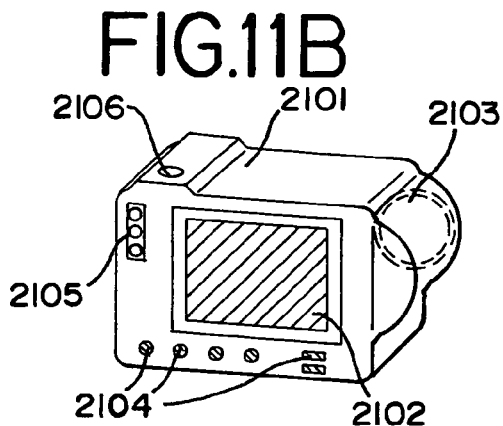

FIG. 11B shows a digital still camera, which comprises a main body 2101, a display unit 2102, an image receiving unit 2103, operation keys 2104. an external connection port 2105, a shutter 2106, etc. The light emitting device to which the repairing method of the present invention is applied can be used for the display unit 2102.

Figure 11C:
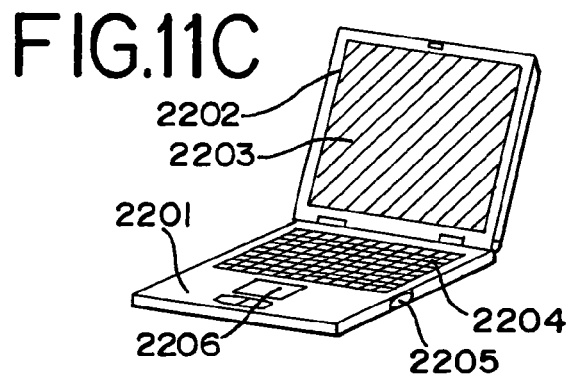

FIG. 11C shows a notebook computer, which comprises a main body 2201, a casing 2202, a display unit 2203, a keyboard 2204, an external connection port 2205, a pointing mouse 2206, etc. The light emitting device to which the repairing method of the present invention is applied can be used for the display unit 2203.

Figure 11D:
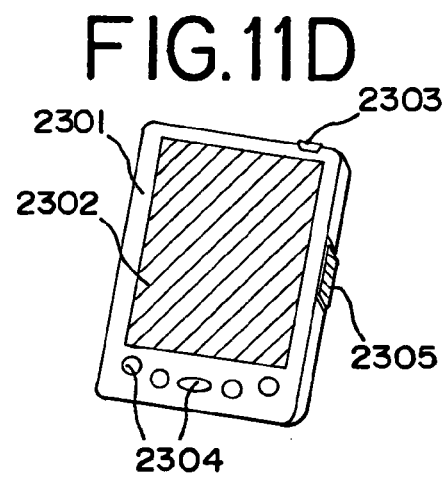

FIG. 11D shows a mobile computer, which comprises a main body 2301, a display unit 2302, a switch 2303, operation keys 2304, an infrared ray port 2305, etc. The light emitting device to which the repairing method of the present invention is applied can be used for the display unit 2302.

Figure 11E:
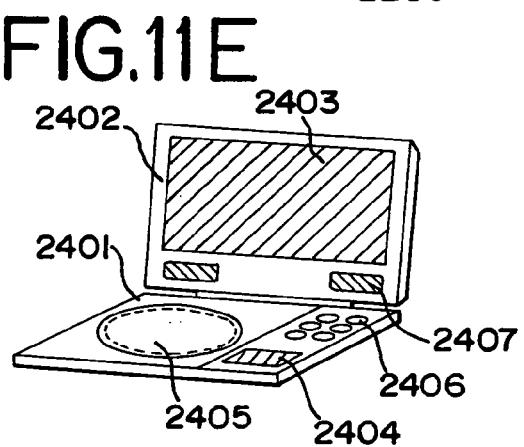

FIG. 11E shows a portable image reproducing device equipped with a recording medium (a DVD player, to be specific). The device comprises a main body 2401, a casing 2402, a display unit A 2403, a display unit B 2404, a recording medium (DVD) reading unit 2405, operation keys 2406, speaker units 2407, etc. The display unit A 2403 mainly displays image information whereas the display unit B 2404 mainly displays text information. The light emitting device to which the repairing method of the present invention is applied can be used for the display units A 2403 and B 2404. The term image reproducing device equipped with a recording medium includes video game machines.

Figure 11F:
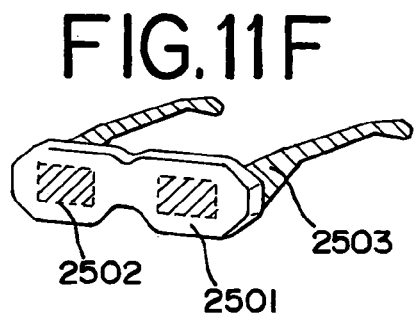

FIG. 11F shows a goggle type display (head mounted display), which comprises a main body 2501, display units 2502, and arm units 2503. The light emitting device to which the repairing method of the present invention is applied can be used for the display units 2502.

Figure 11G:
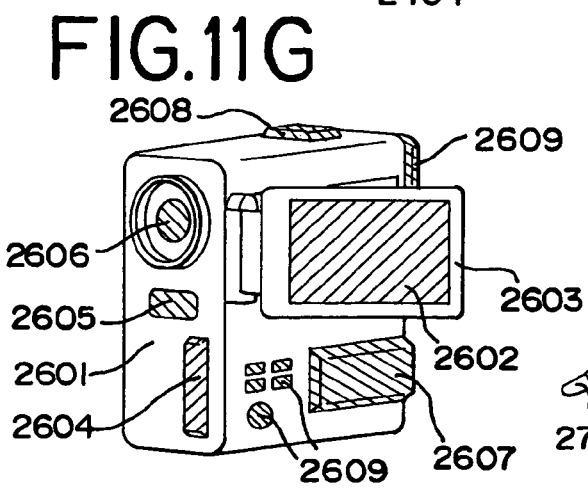

FIG. 11G shows a video camera, which comprises a main body 2601, a display unit 2602, a casing 2603, an external connection port 2604, a remote control receiving unit 2605, an image receiving unit 2606, a battery 2607, an audio input unit 2608, operation keys 2609, etc. The light emitting device to which the repairing method of the present invention is applied can be used for the display unit 2602.

Figure 11H:
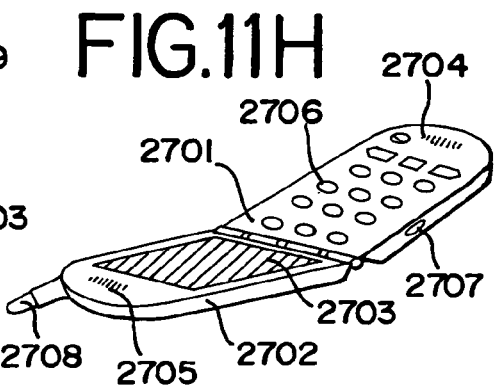
Figure 12A:
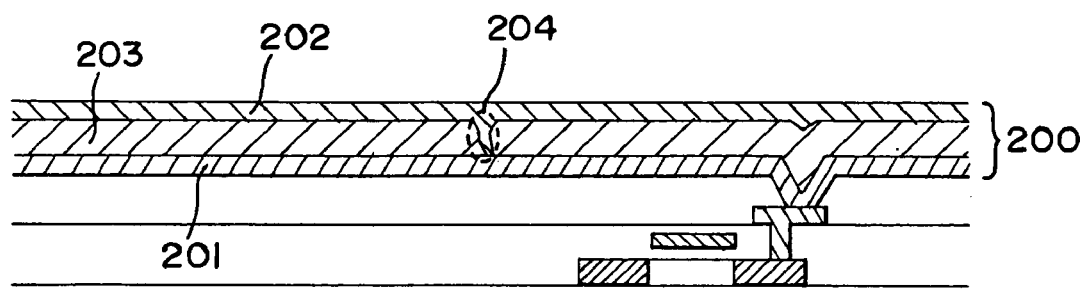
FIGS. 12A and 12B are respectively a sectional view of an EL element having a defect portion and a diagram schematically showing the current flow when a forward bias current flows in the EL element.
Figure 12B:
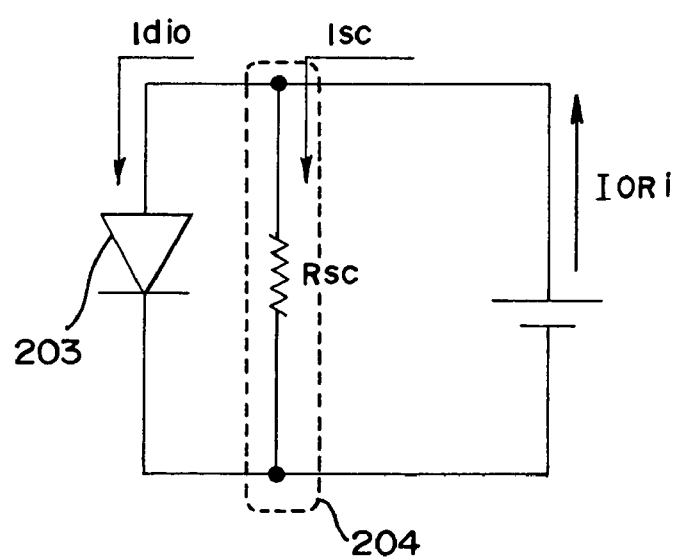
Figure 13A:
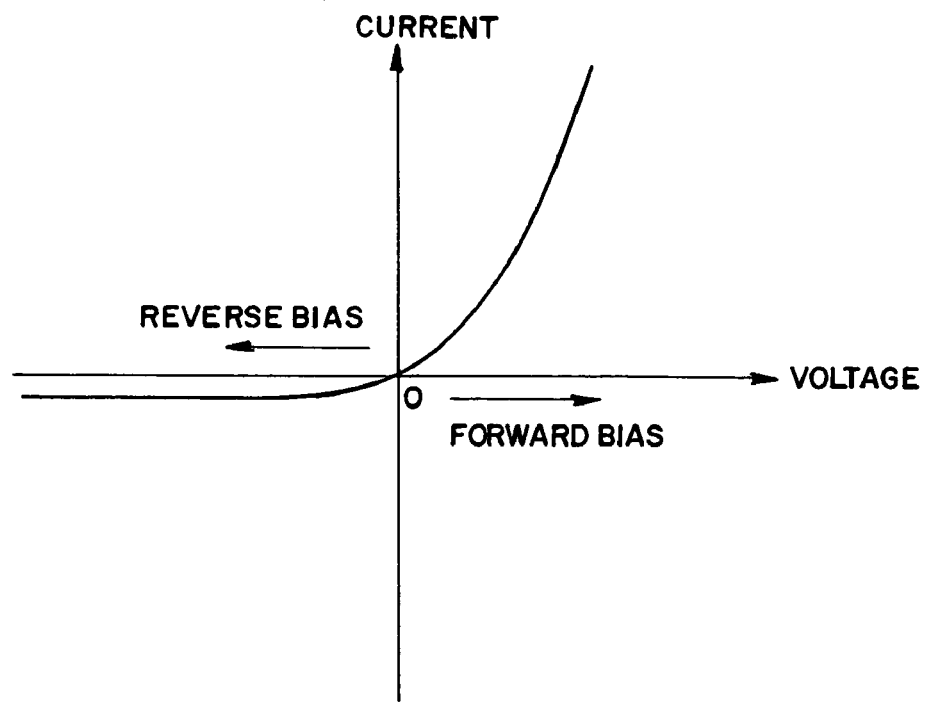
FIGS. 13A and 13B are diagrams showing the voltage-current characteristic of EL elements.
Figure 13B:
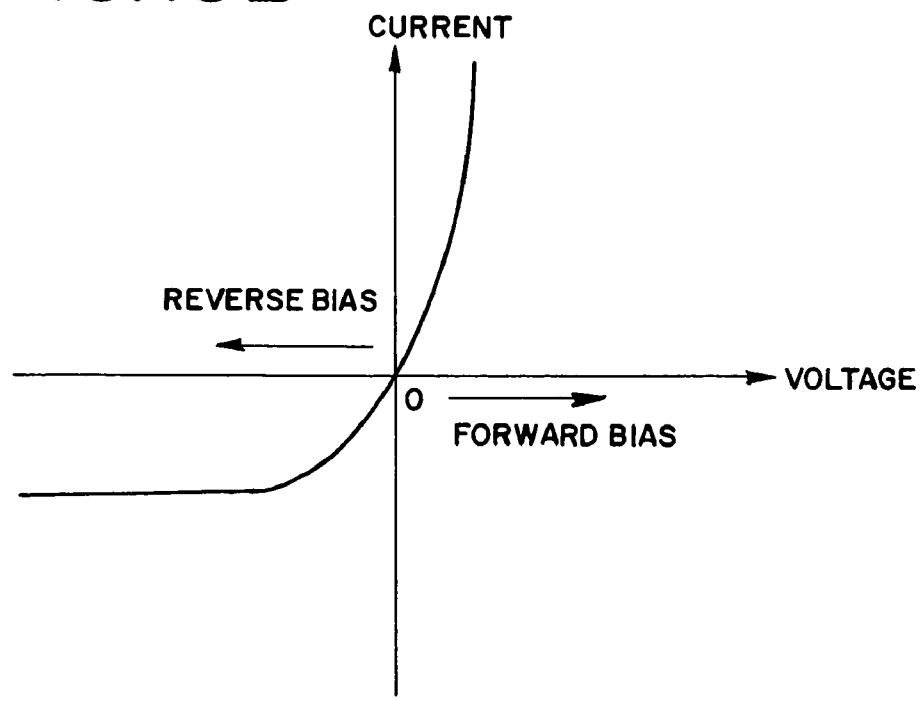

FIG. 11H shows a cellular phone, which comprises a main body 2701, a casing 2702, a display unit 2703, an audio input unit 2704, an audio output unit 2705, operation keys 2706, an external connection port 2707, an antenna 2708, etc. The light emitting device to which the repairing method of the present invention is applied can be used for the display unit 2703. If the display unit 2703 displays white characters on a black background, power consumption of the cellular phone can be reduced.

If the luminance of light emitted from EL materials is increased in future, the light emitting device having an EL element can be used also in a front or rear projector in which light bearing outputted image information is magnified by a lens or the like to be projected on a screen.

The electric equipment given in the above often displays information distributed through electronic communication lines such as Internet and CATV (cable television), especially, animation information with increasing frequency. The light emitting device having an EL element is suitable for displaying animation information since EL materials have fast response speed.

In the light emitting device, portions that emit light consume power. Therefore it is desirable to display information such that as small portions as possible emit light. Accordingly, if the light emitting device is used for a display unit that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electric equipment of every field can employ the device. The electric equipment in this embodiment may use any of the structures shown in Embodiments 1 through 11.

[Embodiment 13]

This embodiment describes a case of applying a repairing method of the present invention to a passive (simple) matrix light emitting device.

Figure 19A:
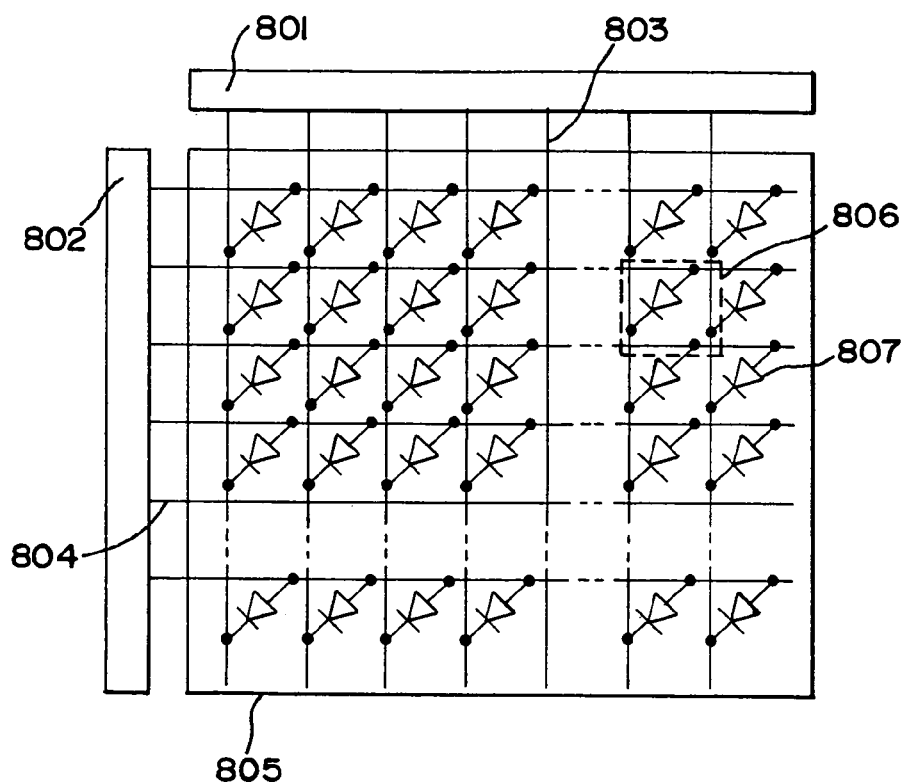
FIGS. 19A and 19B are diagrams of a passive matrix light emitting device to which a repairing method of the present invention is applied.

FIG. 19A shows the structure of a passive matrix light emitting device. Reference numeral 805 denotes a pixel portion, which has a plurality of pixels 806. Each pixel has one of plural data lines 803 and one of plural scanning lines 804. EL layers are formed between the data lines 803 and the scanning lines 804. The data lines 803 and the scanning lines 804 serve as electrodes. The EL layers and the electrodes constitute EL elements 807.

Signals to be inputted to the data lines 803 are controlled by a data line driving circuit 801, and signals to be inputted to the scanning lines 804 are controlled by a scanning line driving circuit 802.

Figure 19B:
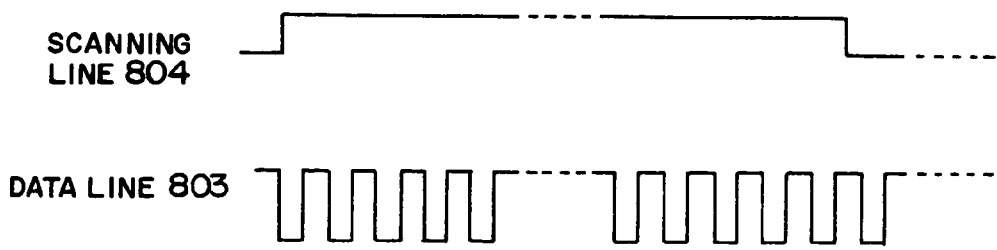

FIG. 19B shows the voltage level of signals inputted to the scanning lines 804 and the data lines 803 when the repairing method of the present invention is applied. By changing the voltage of the data lines at given time intervals while keeping the voltage of the scanning lines 804 constant, a reverse bias current is caused to flow into the EL elements 807 at given time intervals.

The defect portions of the EL elements 807 may be repaired at once in all of the pixels 805 of the pixel portion 806. Alternatively, the repair may be performed on one line of pixels at a time, or on one pixel at a time.

The method of the present invention can increase the amount of current actually flowing through the EL layer upon application of a forward bias voltage to the EL element even if a pin hole is formed in the EL layer during formation of the layer due to dusts or the like and two layers sandwiching a light emitting layer short-circuit, because the method can raise the resistance of the defect portion where the short circuit takes place by changing the defect portion into the transmuted portion. Therefore the repairing method of the present invention can raise the luminance of emitted light with application of the same level of voltage despite the presence of the defect portion.

Having high resistance $R_{SC}$, the transmuted portion hardly allows a current to flow therein in contrast to the defect portion where there is always a flow of current to accelerate degradation of a part of the EL layer that surrounds the defect portion. Therefore, degradation is not accelerated in a part of the EL layer that surrounds the transmuted portion.

This embodiment may be combined freely with Embodiments 5 through 8, and Embodiment 12.

With the above structures, the method of the present invention can increase the amount of current actually flowing through the EL layer upon application of a forward bias voltage to the EL element even if a pin hole is formed in the EL layer during formation of the layer due to dusts or the like and two layers sandwiching a light emitting layer short-circuit, because the method can raise the resistance of the defect portion where the short circuit takes place by changing the defect portion into the transmuted portion. Therefore the repairing method of the present invention can raise the luminance of emitted light with application of the same level of voltage despite the presence of the defect portion.

Having high resistance $R_{SC}$, the transmuted portion hardly allows a current to flow therein in contrast to the defect portion where there is always a flow of current to accelerate degradation of a part of the EL layer that surrounds the defect portion. Therefore, degradation is not accelerated in a part of the EL layer that surrounds the transmuted portion.

What is claimed is:

1. A method of repairing a light emitting device comprising:
   applying a first reverse bias voltage between an anode and a cathode of the light emitting device; and
   applying a second reverse bias voltage between the anode and the cathode of the light emitting device after applying the first reverse bias voltage,
   wherein the anode and the cathode are located in a light emitting element with a light emitting layer interposed therebetween,
   wherein the first reverse bias voltage and the second reverse bias voltage are selected between zero volt and an avalanche voltage, and
   wherein magnitude of the second reverse bias voltage is lower than magnitude of the first reverse bias voltage.

2. A method according to claim 1, wherein the first reverse bias voltage and the second reverse bias voltage are within ±15% of an avalanche voltage of the light emitting element.

3. A method according to claim 1, wherein the light emitting element is an electroluminescence element.

4. A method according to claim 1, wherein the light emitting layer comprises a defect portion.

5. A method of repairing a light emitting device comprising:
   applying a first reverse bias voltage between an anode and a cathode of the light emitting device; and
   applying a second reverse bias voltage between the anode and the cathode of the light emitting device after applying the first reverse bias voltage, thereby making a portion where a reverse bias current flows between the anode and the cathode insulative,
   wherein the anode and the cathode are located in a light emitting element with a light emitting layer interposed therebetween,
   wherein the first reverse bias voltage and the second reverse bias voltage are selected between zero volt and an avalanche voltage, and
   wherein magnitude of the second reverse bias voltage is lower than magnitude of the first reverse bias voltage.

6. A method according to claim 5, wherein the first reverse bias voltage and the second reverse bias voltage are within ±15% of an avalanche voltage of the light emitting element.

7. A method according to claim 5, wherein the light emitting element is an electroluminescence element.

8. A method according to claim 5, wherein the light emitting layer comprises a defect portion.

9. A method of repairing a light emitting device comprising:
   applying a first reverse bias voltage between an anode and a cathode of the light emitting device; and
   applying a second reverse bias voltage between the anode and the cathode of the light emitting device after applying the first reverse bias voltage, thereby making a portion where a reverse bias current flows between the anode and the cathode highly resistive,
   wherein the anode and the cathode are located in a light emitting element with a light emitting layer interposed therebetween,
   wherein the first reverse bias voltage and the second reverse bias voltage are selected between zero volt and an avalanche voltage, and
   wherein magnitude of the second reverse bias voltage is lower than magnitude of the first reverse bias voltage.

10. A method according to claim 9, wherein the first reverse bias voltage and the second reverse bias voltage are within ±15% of an avalanche voltage of the light emitting element.

11. A method according to claim 9, wherein the light emitting element is an electroluminescence element.

12. A method according to claim 9, wherein the light emitting layer comprises a defect portion.

13. A method of repairing a light emitting device comprising:
   applying a first reverse bias voltage between an anode and a cathode of the light emitting device; and
   applying a second reverse bias voltage between the anode and the cathode of the light emitting device after applying the first reverse bias voltage,
   wherein the anode and the cathode are located in a light emitting element with a light emitting layer interposed therebetween,
   wherein the first reverse bias voltage and the second reverse bias voltage are selected between zero volt and an avalanche voltage,
   wherein magnitude of the second reverse bias voltage is lower than magnitude of the first reverse bias voltage, and
   wherein the first reverse bias voltage and the second reverse bias voltage are rectangular waves.

14. A method according to claim 13, wherein the first reverse bias voltage and the second reverse bias voltage are within ±15% of an avalanche voltage of the light emitting element.

15. A method according to claim 13, wherein the light emitting element is an electroluminescence element.

16. A method according to claim 13, wherein the light emitting layer comprises a defect portion.

17. A method of repairing a light emitting device comprising:
   applying a first reverse bias voltage between an anode and a cathode of the light emitting device; and
   applying a second reverse bias voltage between the anode and the cathode of the light emitting device after applying the first reverse bias voltage, thereby making a portion where a reverse bias current flows between the anode and the cathode insulative,
   wherein the anode and the cathode are located in a light emitting element with a light emitting layer interposed therebetween,
   wherein the first reverse bias voltage and the second reverse bias voltage are selected between zero volt and an avalanche voltage,
   wherein magnitude of the second reverse bias voltage is lower than magnitude of the first reverse bias voltage, and
   wherein the first reverse bias voltage and the second reverse bias voltage are rectangular waves.

18. A method according to claim 17, wherein the first reverse bias voltage and the second reverse bias voltage are within ±15% of an avalanche voltage of the light emitting element.

19. A method according to claim 17, wherein the light emitting element is an electroluminescence element.

20. A method according to claim 17, wherein the light emitting layer comprises a defect portion.

21. A method of repairing a light emitting device comprising:
   applying a first reverse bias voltage between an anode and a cathode of the light emitting device; and applying a second reverse bias voltage between the anode and the cathode of the light emitting device after applying the first reverse bias voltage, thereby making a portion where a reverse bias current flows between the anode and the cathode highly resistive, wherein the anode and the cathode are located in a light emitting element with a light emitting layer interposed therebetween, wherein the first reverse bias voltage and the second reverse bias voltage are selected between zero volt and an avalanche voltage, wherein magnitude of the second reverse bias voltage is lower than magnitude of the first reverse bias voltage, and wherein the first reverse bias voltage and the second reverse bias voltage are rectangular waves.

22. A method according to claim 21, wherein the first reverse bias voltage and the second reverse bias voltage are within ±15% of an avalanche voltage of the light emitting element.

23. A method according to claim 21, wherein the light emitting element is an electroluminescence element.

24. A method according to claim 21, wherein the light emitting layer comprises a defect portion.

25. A method of repairing a light emitting device comprising:

applying a first reverse bias voltage between an anode and a cathode of the light emitting device; and applying a second reverse bias voltage between the anode and the cathode of the light emitting device after applying the first reverse bias voltage, wherein the anode and the cathode are located in a light emitting element with a light emitting layer interposed therebetween, wherein the first reverse bias voltage and the second reverse bias voltage are lower than zero volt, and wherein magnitude of the second reverse bias voltage is lower than magnitude of the first reverse bias voltage.

26. A method according to claim 25, wherein the first reverse bias voltage and the second reverse bias voltage are within ±15% of an avalanche voltage of the light emitting element.

27. A method according to claim 25, wherein the light emitting element is an electroluminescence element.

* * * * *